United States Patent [19]
McClure

[11] Patent Number: 5,896,336
[45] Date of Patent: Apr. 20, 1999

[54] DEVICE AND METHOD FOR DRIVING A CONDUCTIVE PATH WITH A SIGNAL

[75] Inventor: David C. McClure, Carrollton, Tex.

[73] Assignee: STMicroelectronics, Inc., Carrollton, Tex.

[21] Appl. No.: 08/974,747

[22] Filed: Nov. 19, 1997

Related U.S. Application Data

[63] Continuation of application No. 08/587,708, Jan. 19, 1996, abandoned.

[51] Int. Cl.$^6$ .................................................. G11C 7/00
[52] U.S. Cl. ..................... 365/205; 365/207; 365/230.06
[58] Field of Search ........................... 365/189.02, 207, 365/208, 230.02, 230.03, 205, 230.06; 327/51, 52, 53, 57

[56] References Cited

U.S. PATENT DOCUMENTS

| | | | |
|---|---|---|---|
| 4,425,633 | 1/1984 | Swain | 365/194 |
| 4,644,196 | 2/1987 | Flannagan | 307/530 |
| 4,807,191 | 2/1989 | Flannagan | 365/189 |
| 4,962,324 | 10/1990 | Park | 307/350 |
| 5,072,138 | 12/1991 | Slemmer et al. | 307/465 |
| 5,126,970 | 6/1992 | Ul Haq | 365/154 |
| 5,161,159 | 11/1992 | McClure et al. | 371/22.1 |
| 5,191,555 | 3/1993 | Tabacco et al. | 365/230.08 |
| 5,208,776 | 5/1993 | Nasu et al. | 365/200 |
| 5,265,100 | 11/1993 | McClure et al. | 371/21.2 |
| 5,267,210 | 11/1993 | McClure et al. | 365/218 |
| 5,280,205 | 1/1994 | Green et al. | 365/205 |
| 5,294,847 | 3/1994 | Grossman et al. | 365/205 |
| 5,305,268 | 4/1994 | McClure | 365/203 |
| 5,311,467 | 5/1994 | Lysinger et al. | 365/189.01 |
| 5,311,473 | 5/1994 | McClure et al. | 365/201 |
| 5,339,277 | 8/1994 | McClure | 365/230.08 |
| 5,341,336 | 8/1994 | McClure | 365/201 |
| 5,349,243 | 9/1994 | McClure | 307/272.1 |
| 5,357,468 | 10/1994 | Satani et al. | 365/189.01 |
| 5,369,619 | 11/1994 | Ohba | 365/230.03 |
| 5,396,108 | 3/1995 | McClure | 327/108 |
| 5,402,379 | 3/1995 | McClure | 365/203 |
| 5,404,334 | 4/1995 | Pascucci et al. | 365/210 |
| 5,408,435 | 4/1995 | McClure et al. | 365/201 |
| 5,422,839 | 6/1995 | Ishibashi et al. | 365/51 |
| 5,424,985 | 6/1995 | McClure et al. | 365/194 |
| 5,444,662 | 8/1995 | Tanaka et al. | 365/203 |
| 5,450,019 | 9/1995 | McClure et al. | 326/28 |
| 5,455,798 | 10/1995 | McClure | 365/200 |
| 5,455,802 | 10/1995 | McClure | 365/233 |
| 5,473,567 | 12/1995 | McClure | 365/208 |
| 5,485,430 | 1/1996 | McClure | 365/233 |
| 5,519,650 | 5/1996 | Ichimura et al. | 365/63 |
| 5,554,874 | 9/1996 | Doluca | 257/390 |

*Primary Examiner*—Vu A. Le
*Attorney, Agent, or Firm*—David V. Carlson; Theodore E. Galanthay; Lisa K. Jorgenson

[57] ABSTRACT

A signal driver receives an input signal and an enable signal, and generates an output signal from the input signal when the enable signal has an active state. When the enable signal has an inactive state, the signal driver draws substantially zero supply current regardless of the level of the input signal. The enable signal may be the sense-amplifier enable signal. The signal driver may also include an input circuit that receives the input signal and generates an intermediate signal from the input signal when the enable signal has the first state. An output circuit is coupled to the input circuit, receives the intermediate signal, and generates the output signal from the intermediate signal. A switch circuit is coupled to the input circuit, receives the enable signal, and cuts off substantially all supply current to the input circuit when the enable signal has the second state.

33 Claims, 11 Drawing Sheets

DEVICE AND METHOD FOR DRIVING A CONDUCTIVE PATH WITH A SIGNAL

CROSS-REFERENCE TO RELATED APPLICATION

This application is a continuation of U.S. patent application Ser. No. 08/587,708, filed Jan. 19, 1996, now abandoned.

CROSS-REFERENCE TO RELATED APPLICATIONS

The following pending U.S. Patent Applications by David C. McClure entitled: "Architecture Redundancy," Ser. No. 08/582,424 (Attorney's Docket No. 95-C-136), and "Redundancy Control," Ser. No. 08/580,827 (Attorney's Docket No. 95-C-143), which were filed on Dec. 29, 1995, and have the same ownership as the present application, and to that extent are related to the present application, which are incorporated herein by reference; and entitled: "Test Mode Activation And Data Override," Ser. No. 08/587,709 (Attorney's Docket No. 95-C-137), "Pipelined Chip Enable Control Circuitry And Methodology," Ser. No. 08/588,730 (Attorney's Docket No. 95-C-138), "Output Driver Circuitry Having A Single Slew Rate Resistor," Ser. No. 08/588,988 (Attorney's Docket No. 95-C-139), "Synchronous Stress Test Control," Ser. No. 08/589,015 (Attorney's Docket No. 95-C-142), "Write Pass Through Circuit," Ser. No. 08/588,662 (Attorney's Docket No. 95-C-144), "Data-Input Device For Generating Test Signals On Bit And Bit-Complement Lines," Ser. No. 08/588,762 (Attorney's Docket No. 95-C-145), "Synchronous Output Circuit," U.S. Pat. No. 5,619,456 (Attorney's Docket No. 95-C-146), "Write Driver Having A Test Function," Ser. No. 08/589,141 (Attorney's Docket No. 95-C-147), "Circuit And Method For Tracking The Start Of A Write To A Memory Cell," Ser. No. 08/589,139 (Attorney's Docket No. 95-C-148), "Circuit And Method For Terminating A Write To A Memory Cell," Ser. No. 08/588,737 (Attorney's Docket No. 95-C-149), "Clocked Sense Amplifier With Word Line Tracking," Ser. No. 08/587,782 (Attorney's Docket No. 95-C-150), "Memory-Row Selector Having A Test Function," Ser. No. 08/589,140 (Attorney's Docket No. 95-C-151), "Synchronous Test Mode Initialization," Ser. No. 08/588,729 (Attorney's Docket No. 95-C-153), "Device And Method For Isolating Bit Lines From A Data Line," Ser. No. 08/588,740 (Attorney's Docket No. 95-C-154), "Circuit And Method For Setting The Time Duration Of A Write To A Memory Cell," Ser. No. 08/587,711 (Attorney's Docket No. 95-C-156), and "Low-Power Read Circuit And Method For Controlling A Sense Amplifier," U.S. Pat. No. 5,619,466 (Attorney's Docket No. 95-C-168), and by Mark Lysinger entitled: "Burst Counter Circuit And Method Of Operation Thereof," Ser. No. 08/589,029 (Attorney's Docket No. 95-C-141), all of which have the same effective filing date and ownership as the present application, and to that extent are related to the present application, which are incorporated herein by reference.

TECHNICAL FIELD

The present invention relates generally to electronic devices, and more particularly, to a device and method for driving a conductive path, such as a data line, with a signal during a read cycle, and drawing substantially no current from the power supply during a write cycle.

BACKGROUND OF THE INVENTION

To reduce the number of internal components and the degradation of the read signal, many memory devices lack dedicated pass-gate transistors to couple and uncouple the read circuits, which each typically include a sense amplifier, equilibrate circuit, and a data-line driver, to and from the read lines during a read cycle and a write cycle respectively. Typically, in such a memory device, the column-select transistors that are used to connect the bit lines to the read lines also isolate the read circuits from the bit lines when the sense amplifier is enabled or clocked. Often, such a memory device couples both the read and the write lines to the bit lines of an addressed memory cell during both a read and a write cycle. Thus, the memory device often couples the read circuits to the write lines during a write cycle. Such coupling, however, typically does not affect the reading of data from or the writing of data to the memory cell.

A problem with such a memory device is that during a write cycle, the data-line drivers, which the memory device does not use during a write cycle, may draw a current, often called a "crowbar" current, from the power supply. A data-line driver acts as an interface between a read line and a data line of the data bus. During a read cycle, the sense amplifier amplifies the data signal from the addressed memory cell, and provides the amplified data signal on the read line. The data-line driver receives the amplified data signal on the read line and provides it to the data line. During a write cycle, the data-line driver ideally uncouples the read line from and presents a high impedance to the data line while drawing little or no supply current. During a write cycle, however, the transistor that couples the read line to the bit line of the addressed memory cell often generates on the read line a body-effected threshold voltage that is between a logic 0 (typically 0 volts) and a logic 1 (typically 5 volts). This body-effected threshold voltage is often sufficient to partially activate the input stage of the data-line driver, and thus cause the data-line driver to draw a supply current. The sum of such currents from all of the partially activated data-line drivers can be significant.

The sum of these crowbar currents may be sufficient to render such a memory device unsuitable for low-power applications, such as battery applications. Furthermore, the additional heat that these currents generate may shorten the lifetime of the memory device, or necessitate more complicated heat dissipation techniques or structures. Moreover, during stressing of the memory device, a higher-than normal power-supply voltage is applied to hasten the burn in of the memory device. For example, in a memory device that normally operates with a 5-volt supply, a 9-volt supply is used during stressing. Thus, because they may be even larger than during normal operation of the memory device, the crowbar currents may cause more severe heating problems or other problems during stress testing of the memory device.

SUMMARY OF THE INVENTION

In accordance with one aspect of the invention, a signal driver receives an input signal and an enable signal, generates an output signal from the input signal when the enable signal has a first state, and draws substantially no supply current when the enable signal has a second state, regardless of the level of the input signal.

In accordance with a related aspect of the invention, the signal driver includes an input circuit that receives the input signal and generates an intermediate signal from the input signal when the enable signal has the first state. An output circuit is coupled to the input circuit, receives the intermediate signal, and generates the output signal from the intermediate signal. A first switch circuit is coupled to the input circuit, receives the enable signal, and cuts off substantially all supply current to the input circuit when the enable signal has the second state.

In accordance with another related aspect of the invention, the enable signal is the sense-amplifier enable signal.

An advantage provided by one aspect of the present invention is a signal-driver circuit, which in one mode of operation, draws substantially no supply current regardless of the level of the input signal.

Various embodiments of a signal driver according to the present invention are discussed below, particularly in conjunction with FIGS. 2 and 7.

DETAILED DESCRIPTION OF THE INVENTION

Figure 1:
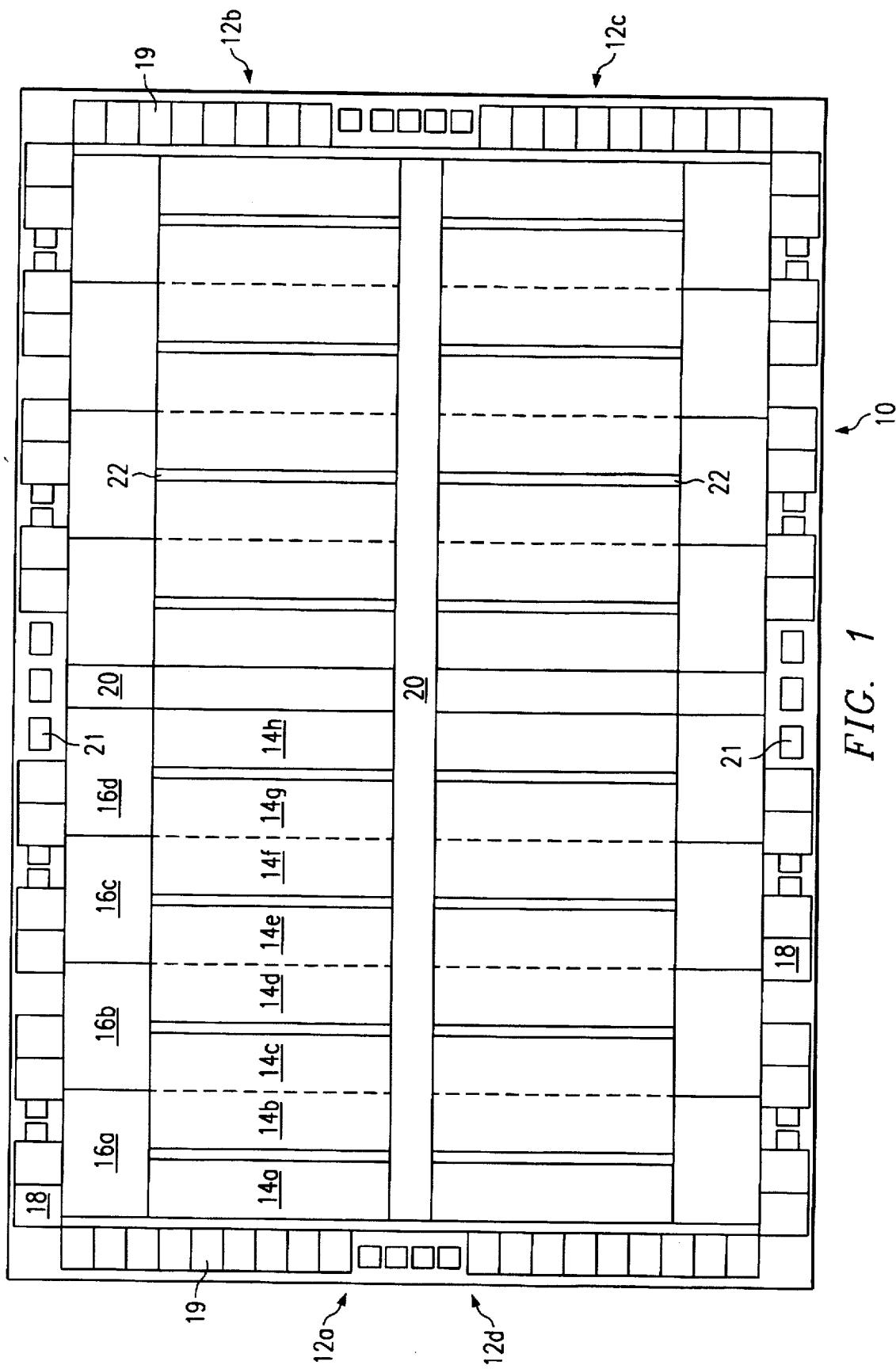
FIG. 1 is a block diagram of a memory device in accordance with the present invention.

FIG. 1 is a block diagram of a memory device 10 that is formed in accordance with the present invention. In one embodiment of the invention, the memory device 10 is a 32K×32 bit static random access memory (SRAM). The memory device 10 according to this embodiment includes four quadrants 12a–d, which each include eight blocks 14a–h of conventional memory cells (not shown in FIG. 1) that are arranged in rows and columns. The dashed lines outline the memory blocks 14 in each quadrant 12, but represent no physical structure of the memory device 10. Together, the memory blocks 14 form a memory-cell array. Each quadrant 12 also includes four blocks 16a–d of input/output (I/O) circuitry, which couple data to and from the memory blocks 14, and address information to the memory blocks 14. Each I/O block 16 is associated with a corresponding pair of memory blocs 14. For example, the I/O block 16a may provide I/O circuitry for the memory blocks 14a and 14b. The memory device 10 also includes a number of data pins 18, address and control pins 19, and power pins 21, which respectively receive conventional data, address and control, and power signals. The pins 18, 19, and 21 may also be referred to as pads or terminals. In the described embodiment of the invention, the memory device 10 includes 32 data pins 18 and fifteen address pins 19. Typically, particular data pins 18 are associated with a particular quadrant 12. For example, the data pins 18 carrying the data bits 0–7 may be coupled to the memory blocks 14 in the quadrant 12a, the data pins 18 carrying the data bits 8–15 to the memory blocks 14 in the quadrant 12b, the data pins 18 carrying the data bits 16–23 to the memory blocks 14 in the quadrant 12c, and the data pins 18 carrying the data bits 24–31 to the memory blocks 14 in the quadrant 12d. Additional circuitry, such as row-select and read/write circuitry (not shown in FIG. 1), may be located in the mid-section 20 and in the block divider sections 22. Such circuitry is further discussed below in conjunction with FIGS. 2–14.

In operation of the described embodiment of the memory device 10, during a memory-cell access cycle such as a read or write cycle, one memory block 14 from each quadrant 12 provides data to or receives data from the external data pins 18 via the associated I/O blocks 16. For example, if the memory device 10 simultaneously accesses 32 data bits via the data pins 18, a selected block 14 in each of the quadrants 12 (a total of four memory blocks 14) provides or receives 8 bits of data. In other memory access modes, more or fewer data bits may be accessed each cycle. But typically, only one memory block 14 per quadrant 12 is accessed during each cycle.

Figure 2:
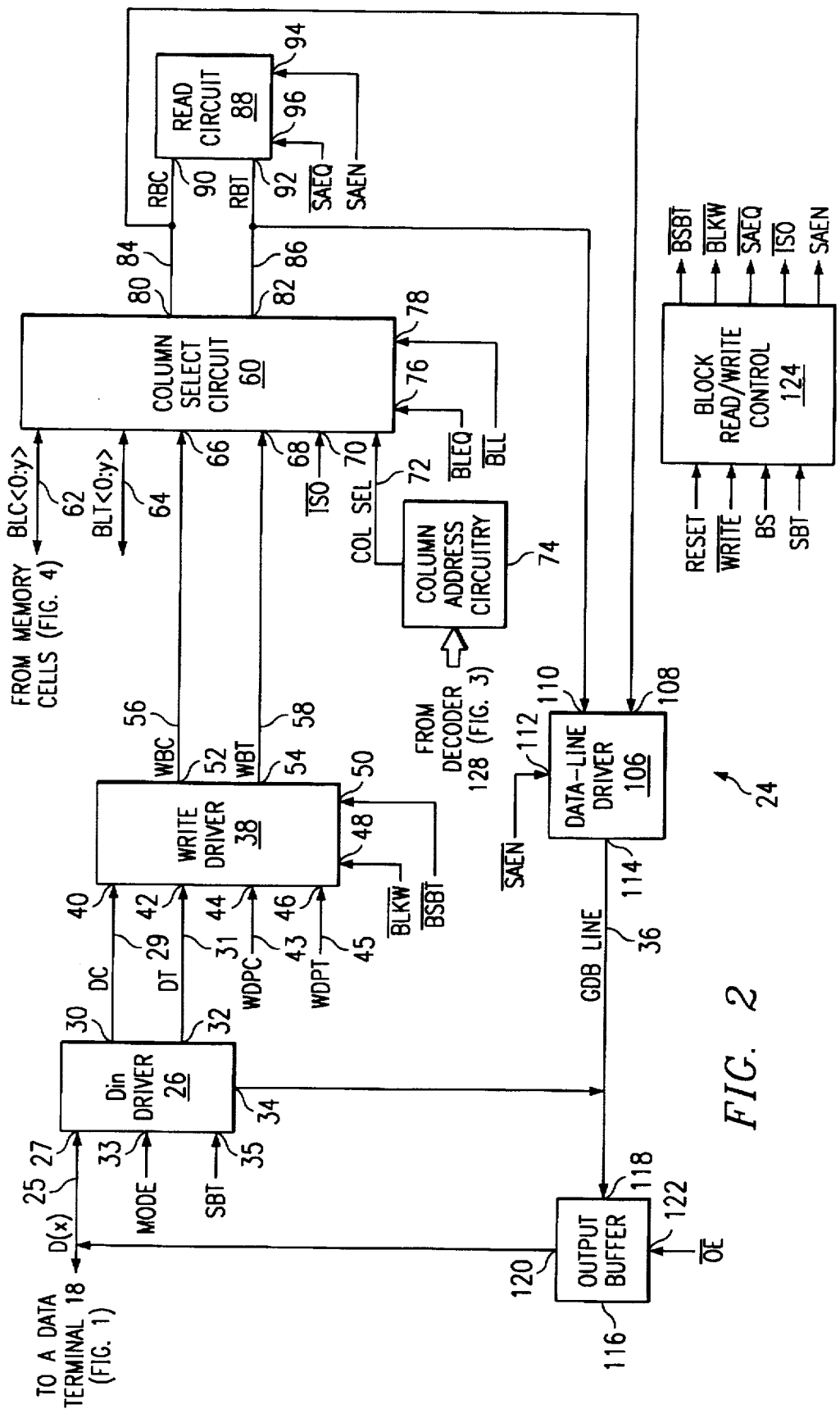
FIG. 2 is block diagram of one embodiment of the read/write circuit of the memory device of FIG. 1.

FIG. 2 is a block diagram of one embodiment of the read/write (R/W) circuitry 24 for the memory device 10 of FIG. 1. A data input buffer 26 has an input terminal 27 coupled to a data pin 18 via a data line 25. For clarity, the data pin 18 is shown as assigned to a data bit which represents the Xth data bit out of a total number of data bits D(x). The data input buffer 26 also has first and second output terminals 30 and 32, which respectively couple data-complement (DC) and data-true (DT) signals to DC line 29 and DT line 31. A data pass-through terminal 34 is coupled to a global data-bus (GDB) line 36. Terminals 33 and 35 respectively receive MODE and single-bit-test (SBT) signals. Typically, the R/W circuitry 24 includes one data input buffer 26 for each data pin 18 of the memory device 10.

A write driver 38 has first and second input terminals 40 and 42, which are respectively coupled to DC line 29 and DT line 31. A write power terminal 44 is coupled to a write-driver-power-complement (WDPC) line 43, and a write-complement power terminal 46 is coupled to a write-driver-power-true (WDPT) line 45. Typically, the WDPC and WDPT lines 43 and 45 are both coupled to the power-supply voltage Vcc that powers the memory device 10. A pair of control terminals 48 and 50 respectively receive a block write (BLKW) and a block single-bit test (BSBT) signal. The bar over the signal names indicates that these signals are active low. A pair of output terminals 52 and 54 respectively provide a write-complement signal to a write-bus-complement (WBC) line 56 and a write-true signal to a write-bus-true (WBT) line 58. The R/W circuitry 24 typically includes one write driver 38 per memory block 14 for each data line 25 that is coupled to the block 14. For example, where 8 data lines 25 are coupled to each memory block 14, the R/W circuitry 24 includes 8 write drivers 38 per block 14. Furthermore, the WDPC and WDPT lines 43 and 45 are typically coupled to, and thus common to, all of the write drivers 38 in the R/W circuitry 24.

A column select circuit 60 is coupled to a bit-line-complement (BLC) bus 62 and bit-line-true (BLT) bus 64, which are coupled to one or more columns of memory cells in an associated memory block 14. In one embodiment of the invention, the BLC and BLT busses each include 16-bit-complement and bit-true lines respectively, i.e., the BLC and BLT busses together couple sixteen columns of memory cells to the column-select circuit 60. Write terminals 66 and 68 are respectively coupled to the WBC and WBT lines 56 and 58. An isolation terminal 70 receives an isolation ($\overline{ISO}$) signal, and a column-select bus 72 provides column-select signals from a column-address circuit 74, which is coupled to an address decoder (not shown in FIG. 2). An equilibrate terminal 76 receives an equilibrate ($\overline{EQ}$) signal, and a load terminal 78 receives a bit-line-load ($\overline{BLL}$) signal. Read terminals 80 and 82 respectively provide read-complement and read-true signals to a read-bus-complement (RBC) line 84 and a read-bus-true (RBT) line 86. The R/W circuitry 24 typically includes one column select circuit 60 for each write driver 38. Thus, where the R/W circuitry 24 includes 8 write drivers 38 per block 14 to service 8 data pins 18, the circuitry 24 also includes 8 column-select circuits 60, 8 WBC lines, 8 WBT lines, 8 RBC lines, and 8 RBT lines per block 14.

A read circuit 88 includes a pair of read terminals 90 and 92, which are respectively coupled to the RBC line 84 and the RBT line 86. An enable terminal 94 receives a sense-amplifier enable (SAEN) signal, and an equilibrate terminal 96 receives a sense-amplifier equilibrate ($\overline{SAEQ}$) signal. Typically, the R/W circuitry 24 includes one read circuit 88 for each pair of RBC and RBT lines 84 and 86. Thus, where the circuitry 24 includes 8 RBC lines 84 and 8 RBT lines 86 per memory block 14, the circuitry 24 includes 8 read circuits 88 per memory block 14.

A data-line driver 106 has a pair of input terminals 108 and 110, which are respectively coupled to the RBC and RBT lines 84 and 86, respectively. An enable terminal 112 receives an $\overline{SAEN}$ signal (the complement of SAEN), and an output terminal 114 is coupled to the GDB line 36. Typically, the R/W circuitry 24 includes the same number of data-line drivers 106 and read circuits 88. Thus, where the R/W circuitry 24 includes 8 read circuits 88 per memory block 14, the circuitry 24 includes 8 data-line drivers 106 per memory block 14.

A conventional output buffer 116 has an input terminal 118, which is coupled to the GDB line 36, and an output terminal 120, which is coupled to the data pin 18. The output buffer 116 also has an enable terminal 122 that is coupled to an output enable ($\overline{OE}$) signal.

A block read/write control circuit 124 has input terminals that respectively receive the RESET, $\overline{WRITE}$, block select (BS), and SBT signals, and has output terminals that respectively provide the $\overline{BSBT}$, $\overline{BLKW}$, $\overline{SAEQ}$, $\overline{ISO}$ and SAEN. Typically, the R/W circuitry 24 includes one block read/write control circuit 124 for each memory block 14. In one embodiment of the invention, however, the R/W circuitry 24 includes one block read/write control circuit 124 for each pair of memory blocks 14. In such an embodiment, the circuit 124 generates two of each of the $\overline{BSBT}$, $\overline{BLKW}$, $\overline{SAEQ}$, $\overline{ISO}$, and SAEN signals, one for the memory block 14 to the left of the circuit 124, and one for the memory block 14 to the right of the circuit 124. For example, the circuit 124 generates signals $\overline{BSBTR}$ and $\overline{BSBTL}$, where the "R" and "L" respectively stand for "right" and "left".

The R/W circuitry 24 can operate in a number of "normal" modes, including write and read modes. During a write cycle of a write mode, an external device (not shown) drives the data pins 18 with a data value and drives the address pins 19 with an address value. The R/W circuitry 24 stores this data value in the one or more addressed memory cells. In the embodiment where the memory device 10 has 32 data pins 18, the addressed memory cells are typically located in four memory blocks 14, one per each quadrant 12. During a read cycle of a read mode, the external device drives the address pins 19 with an address value, and the R/W circuitry 24 drives the data pins 18 with the data value stored in the addressed memory cells. As during the write mode for the 32 data-pin embodiment of the memory device 10 typically the addressed memory cells occupy one memory block 14 from each quadrant 12.

The R/W circuitry 24 can also operate in a number of other modes, including a single-bit-test mode. During a single-bit-test mode, which in one embodiment of the invention is a variation of a write mode, the R/W circuitry 24 isolates a selected memory cell from the other circuitry in the memory device 10, and allows an external testing device (not shown) to apply voltage and current signals to the selected memory cell and to measure the electrical characteristics of the selected memory cell. Typically, the external testing device has identified the selected memory cell as defective, and the purpose of the test is to determine the type of defect that caused the selected memory cell to fail. As stated above, to test a defective memory cell in known devices a laser or other cutting means is often used to severe the conductive bit, word, and other lines that are connected to the defective memory cell. Although such severing physically isolates the defective memory cell from the remaining circuitry, it is a very precise and time consuming process. As discussed below, various aspects of the invention allow one to use circuitry on the memory device 10 to electronically isolate the selected memory cell from most or all of the remaining circuitry on the memory device 10. Such electronic isolation is significantly faster than physical isolation, and the test results for an electronically isolated memory cell are essentially as accurate as the test results for a physically isolated memory cell.

In operation during a write cycle to an associated memory block 14, the buffer 26 receives a binary data value at its input 27, and converts this value into complementary data values, i.e., the DC and DT signals. For example, if the data value at the input 27 is a logic 1, then the input buffer 26 generates a logic 0 for DC and a logic 1 for DT. Thus, in normal operation, DC and DT always equal complementary logic levels.

In operation during a single-bit-test mode, when the SBT signal is active high, the buffer 26 can generate the DC and DT signals having the same logic level as well as having different logic levels. That is, the buffer 26 can simultaneously generate a logic 1 or a logic 0 for both DC and DT. As discussed further below in conjunction with FIG. 5, DC and DT having the same logic level allows the write driver 38 to couple a test signal to both the BLC and BLT lines of the memory cell under test, or to uncouple both the BLC and BLT lines from all signals. As discussed further below in conjunction with FIG. 4, in the single-bit-test mode, MODE and data-in signals determine the one of the four possible combinations of logic levels (00, 01, 10, and 11) that DC and DT. Thus, one advantage of the data input buffer 26 is that it requires only one externally accessible pin, the data pin 18, to output multiple combinations of logic levels. Requiring only one externally accessible pin reduces the number of required test pins, and thus reduces the layout area of the memory device 10.

In operation during a write cycle, while the $\overline{BLKW}$ signal is active low and the $\overline{BSBT}$ signal is inactive high, the write driver 38 receives the DC and DT signals, and respectively generates the WBC and WBT signals having the same logic levels as DC and DT. The write driver 38 generates a logic 1 for WBC and WBT by respectively coupling the WBC and WBT lines 56 and 58 to the WDPC and WDPT lines 43 and 45. The write driver 38 generates a logic 0 for WBC and WBT by respectively coupling the WBC and WBT lines 56 and 58 to ground. For example, if DC is a logic C and DT is a logic 1, then the write driver 38 couples the WBC line 56 to ground and couples the WBT line 58 to the WDPT line 45. Thus, in normal operation, because WDC and WBT respectively equal DC and DT, WBC is always a different logic level than WBT.

In operation during a single-bit-test mode, the $\overline{BSBT}$ signals that are associated with the unselected memory blocks 14 are active low. These active $\overline{BSBT}$ signals cause the unselected write drivers 38 to respectively uncouple the associated WBC and WBT lines 56 and 58 from the WDPC and WDPT lines 43 and 45. Such uncoupling reduces the parasitic capacitance and other parasitic effects that are coupled via the WDPC and WDPT lines 43 and 45 to the memory cell selected for testing. For the write drivers 38 that are associated with the selected memory blocks 14, but not associated with the memory cell selected for testing, the data buffer 26 generates a logic 0 for DC and DT to cause these write drivers 38 to also respectively uncouple the associated WBC and WBT lines 56 and 58 from the WDPC and WDPT lines 43 and 45. This uncoupling further reduces the parasitic effects that are coupled via the WDPC and WDPT lines 43 and 45 to the memory cell selected for testing. Thus, because only the write driver 38 associated with the memory cell selected for testing respectively couples the associated WBC and WBT lines 56 and 58 to the WDPC and WDPT lines 43 and 45, the external testing device can measure the electrical characteristics of the memory cell free of most if not all parasitic effects. For example, in a 32 data-pin memory device 10, there is one selected memory block 14 per quadrant 12, with each selected block 14 having 8 write drivers 38. Thirty one of these thirty two write drivers 38 are effectively disabled by a logic 0 on the associated DC and DT lines 29 and 31. Thus, only the write driver 38 that is associated with the memory cell selected for testing is enabled. The write driver 38 is further discussed below in conjunction with FIG. 5.

During a write cycle, while the $\overline{ISO}$ signal is inactive high, the column-select circuit 60 respectively couples the WBC and WBT lines 56 and 58 to the BLC and BLT lines of the memory cell addressed by the column-select signals on the column-select bus 72. Thus, the circuit 60 allows the write driver 38 to write the data on the data pin 18 (i.e., the value of the data bit D(x)) into the addressed memory cell. The circuit 60 may also respectively couple the BLC and BLT lines of the selected memory cell to the RBC and RBT lines 84 and 86. This aspect of the circuit 60 eliminates the need for additional read-circuit isolation gates, which often degrade the read-data signal from the addressed memory cell. An advantage provided by the R/W circuitry 24 is that, unlike known R/W control circuits, each block read/write control circuit 124 generates a unique $\overline{ISO}$ signal for the circuit or circuits 60 associated with each memory block 14. For example, if the memory device 10 includes 32 memory blocks 14, then the block read/write control circuits 124 together generate 32 $\overline{ISO}$ signals. The $\overline{ISO}$ signals for all of the unselected blocks 14 are active low to disable the associated column select circuits 60. If these associated circuits 60 are enabled, as they are in many known memory devices, then they unnecessarily draw dynamic current from the power supply due to causing the transitioning column-select signals switching of internal components. Thus, the disabling of the unused column-select circuits 60 greatly reduces the power consumption of the memory device 10, and renders it more suitable for low-power applications, such as battery-powered applications. For example, if the memory device 10 has 32 memory blocks 14, and four blocks 14 are enabled during a write cycle, than the memory device 10 will draw only ⅛ of the dynamic current it would draw if the column-select circuits 60 that are associated with the 28 unselected memory blocks 14 were enabled.

During a read cycle, the column select circuit 60 respectively couples the BLC and BLT lines that are associated with the addressed memory cell to the RBC and RBT lines 84 and 86. In one embodiment of the invention, the circuit 60 respectively uncouples the BLT and BLC lines from the RBC and RBT lines 84 and 86 a predetermined time after the beginning of the read cycle. The predetermined time is sufficient to allow the read circuit 88 to sense the data signals on the RBC and RBT lines 84 and 86. Such uncoupling disconnects the read circuit 88 from the parasitic components of the BLT and BLC lines and the addressed memory cell, and allows the read circuit 88 to operate faster. As during the write cycle, the respective $\overline{ISO}$ signals enable only the column-select circuits 60 that are associated with the selected blocks 14, the column select circuit 60 is further discussed below in conjunction with FIG. 6.

During a read cycle, while the SAEN signal is active high, the read circuit 88 amplifies the data signals on the RBC and RBT lines 84 and 86.

As discussed above, during a write cycle, the column-select circuits 60 associated with a selected block 14 may also respectively couple the RBC and RBT lines 84 and 86 to the BLC and BLT lines. In many known devices, such coupling causes the read circuit 88 to draw current from the power supply during a write cycle. An advantage provided by the read circuit 88 is that it draws substantially zero supply current during a write cycle when the RBC and RBT lines 84 and 86 are respectively intercoupled to the BLC and BLT lines. To provide this advantage, the block read/write control circuits 124 generate an inactive high level for the $\overline{SAEQ}$ signals associated with the selected memory blocks 14 during both read and write cycles. In one embodiment of the invention, the block read/write control circuits 124 generate active low levels for the $\overline{SAEQ}$ signals only when the associated memory blocks 14 are unselected. The read circuit 88 is further discussed below in conjunction with FIG. 7.

During a read cycle, when $\overline{SAEN}$ is active low, the data-line driver 106 converts the data signals on RBC and RBT lines 84 and 86 into a single data signal, which it provides on the GDB line 36. While $\overline{OE}$ is active low, the output buffer 116 couples this read-data signal as the data bit D(x) on the pin 18.

During a write cycle, while the column-select circuit 60 respectively couples the BLC and BLT lines to the RBC and RBT lines 84 and 86, the driver 106, unlike many known drivers, draws substantially zero supply current. The driver 106 is further discussed below in conjunction with FIG. 7.

In operation, during write and read cycles and during the single-bit test mode, the block read/write control circuit 124 generates the $\overline{BSBT}$, $\overline{BLKW}$, $\overline{SAEQ}$, $\overline{ISO}$, and SAEN signals as discussed above.

Figure 3:
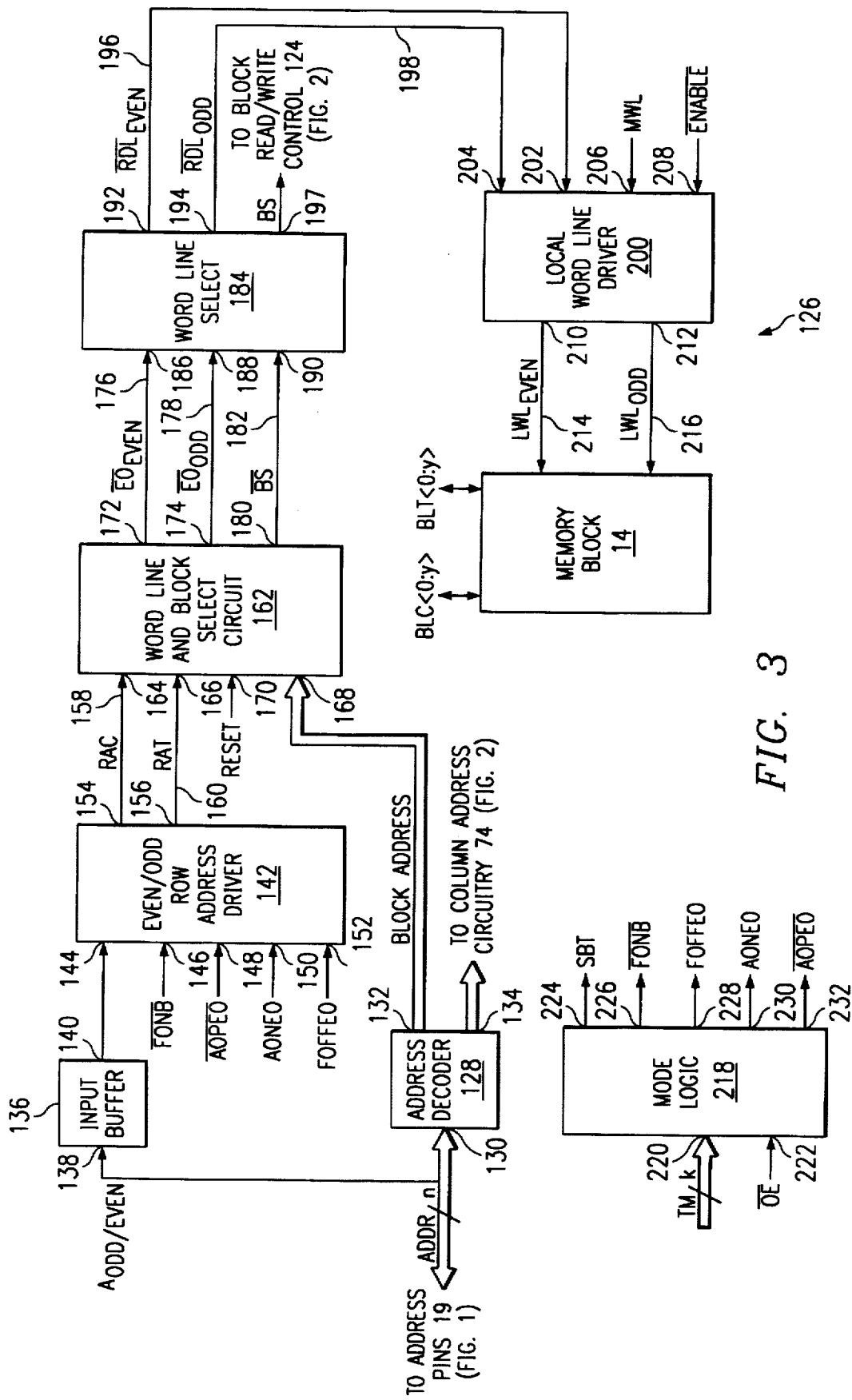
FIG. 3 is a block diagram of one embodiment of the row-addressing circuit of the memory device of FIG. 1.

FIG. 3 is a block diagram of a row address circuit 126 of the memory device 10 of FIG. 1. The circuit 126 includes an address decoder 128 that has one or more input terminals 130, which are coupled to the individual address lines of an address bus ADDR. The address bus ADDR is coupled to the address pins 19 of the memory device 10. The address decoder 128 generates at a first set of output terminals 132 a memory-block-select address, and generates at a second set of outputs 134 the column-select signals on the column-select bus 72.

An address input buffer 136 includes an input terminal 138, which is coupled to the address line of the address bus ADDR that carries the address bit that identifies the type of row of memory cells, either even or odd, to be addressed. The buffer 136 also includes an output terminal 140, which provides a buffered address bit. Typically, there is one input buffer 136 associated with each address pin 19. Thus, where there are 14 address pins 19, there are 14 input buffers 136.

An even/odd-row-address driver 142 has an input 144 coupled to the output terminal 140 of the input buffer 136. The driver 142 also includes input terminals 146, 148, 150 and 152, which respectively receive signals $\overline{FONB}$, $\overline{AOPEO}$, AONEO, and FOFFEO. The driver 142 includes output terminals 154 and 156, which respectively provide the row-address complement (RAC) and row-address true (RAT) signals on the RAC and RAT lines 158 and 160. Typically, the row-address circuit 126 includes one driver 142 and one pair of RAC and RAT lines 158 and 160 for the entire memory device 10.

A word-line-and-block select circuit 162 includes a pair of input terminals 164 and 166, which respectively receive the RAC and RAT signals from the RAC and RAT lines 158 and 160. A set of block-address input terminals 168 receive the block-select address from the individual lines of the block-address bus. A reset terminal 170 receives RESET. A pair of output terminals 172 and 174 respectively provide row even ($\overline{EO}_{EVEN}$) row odd ($\overline{EO}_{ODD}$) signals to the $\overline{EO}_{EVEN}$ line 176 and the $\overline{EO}_{ODD}$ line 178. An output terminal 180 provides one $\overline{BS}$ (the complement of BS) to a $\overline{BS}$ line 182. Typically, the row-address circuit 126 includes one circuit 162 for each pair of memory blocks 14. Thus, where the memory device 10 includes 32 memory blocks 14, the row-address circuit 126 includes 16 circuits 162. In such an embodiment, each circuit 162 generates the $\overline{EO}_{EVEN}$, $\overline{EO}_{ODD}$, and a $\overline{BS}$ signals for both of the memory blocks 14 with which it is associated.

A word-line-select circuit 184 includes a pair of input terminals 186 and 188, which respectively receive the $\overline{EO}_{EVEN}$ and the $\overline{EO}_{ODD}$ signals from the $\overline{EO}_{EVEN}$ line 176 and the $\overline{EO}_{ODD}$ line 178. An input terminal 190 receives $\overline{BS}$ from the $\overline{BS}$ line 178. A pair of output terminals 192 and 194 respectively provide row-driver-line even ($\overline{RDL}_{EVEN}$) and row-driver-line odd ($\overline{RDL}_{ODD}$) signals to the $\overline{RDL}_{EVEN}$ and $\overline{RDL}_{ODD}$ lines 196 and 198. An output terminal 196 provides BS to the block read/write control circuit 124 (FIG. 2). In one embodiment of the invention, the row-address circuit 126 includes one word-line-select circuit 184 for each memory block 14. For example, if the memory device 10 includes 32 memory blocks 14, the row-address circuit 126 includes 32 word-line-select circuits 184.

A local word-line driver 200 includes input terminals 202 and 204, which respectively receive the $\overline{RDL}_{EVEN}$ and $\overline{RDL}_{ODD}$ signals from the $\overline{RDL}_{EVEN}$ and $\overline{RDL}_{ODD}$ lines 196 and 198. Input terminals 206 and 208 respectively receive master-word-line (MWL) and word-line-driver-enable ENABLE signals. Output terminals 210 and 212 respectively provide local-word-line-even ($LWL_{EVEN}$) and local-word-line-odd ($LWL_{ODD}$) signals on $LWL_{EVEN}$ and $LWL_{ODD}$ lines 214 and 216, which are coupled to the memory cells in a corresponding memory block 14. Typically, the row-address circuit 126 includes one local word-line driver 200 for every two rows of memory cells in a memory block 14. For example, if each memory block 14 includes 260 rows (256 rows of array memory cells and four rows of redundant memory cells), the row-address circuit 126 includes 130 local word-line drivers 200 per block 14.

The row-address circuit 126 also includes a test-mode logic circuit 218. A set of input terminals 220 receives a test-mode-selection (TM) signal from a TM bus. An input terminal 222 receives the $\overline{OE}$ signal. Output terminals 224, 226, 228, 230, and 232 respectively provide the SBT, $\overline{FONB}$, FOFFEO, AONEO, and $\overline{AOPEO}$ signals.

In operation during a write or a read cycle, the input buffer 136 receives from the address bus ADDR the address bit that indicates the type of row, even or odd, that contains the addressed memory cell. For example, in one embodiment of the invention, if the address bit is a logic 0, then the addressed memory cell is in an even row, and if the address bit is a logic 1, then the addressed memory cell is in an odd row. The input buffer 140 provides the buffered address bit to the even/odd-row-address driver 142. The driver 142 generates on the RAC and RAT lines 156 and 158 the complementary RAC and RAT signals, which together indicate the type of the addressed row. For example, if RAC is a logic 0 and RAT is logic 1, the addressed row is even, and if RAC is logic 1 and RAT is logic 0, the addressed row is odd. Thus, during a write or a read cycle, RAC and RAT equal opposite logic levels. The address input buffer 136 is further described below in conjunction with FIG. 9.

During a single-bit-test mode, in response to the SBT, $\overline{FONB}$, FOFFEO, AONEO, and $\overline{AOPEO}$ signals, the even/odd-row-address driver 142 can generate RAC and RAT having the same logic level to deactivate all the word lines in the selected blocks 14, including the word line coupled to the memory cell selected for testing. Deactivating this word line is sometimes necessary to measure the leakage currents of access devices of the selected memory cell. Generating a logic 1 for $\overline{OE}$ places the circuit 142 in this word-line-deactivation state. Furthermore, it is sometimes desired to simultaneously write to all the memory cells in a selected memory block 14. During such a mode, often called a stress test mode, the circuit 142, in response to the SBT, $\overline{FONB}$, FOFFEO, AONEO, and $\overline{AOPEO}$ signals, also generates RAC and RAT having the same logic level to activate all the word lines in the selected blocks 14. The circuit 142 is further discussed below in conjunction with FIG. 10.

In operation during a write or a read cycle, the word-line-and-block-select circuit 162 generates from the RAC and RAT signals the $\overline{EO}_{EVEN}$ and $\overline{EO}_{ODD}$ signals. For example, if $\overline{EO}_{EVEN}$ is logic 0 and $\overline{EO}_{ODD}$ is logic 1, then an even row is addressed. Conversely, if $\overline{EO}_{EVEN}$ is logic 1 and $\overline{EO}_{ODD}$ is logic 0, then an odd row is addressed. The circuit 162 also decodes the block address from the block-address bus and generates an active level (here logic 0) for $\overline{BS}$ whenever the block-select address selects the memory block 14 with which the circuit 162 is associated, i.e., the associated block 14 contains an addressed memory cell. For example, if the memory device 10 has 8 memory blocks 14 per quadrant 12, and one block 14 per quadrant 12 is accessed during a write or a read cycle, the block address has three bits to address 8 sets of blocks 14. The circuit 162 is further described below in conjunction with FIG. 11.

In operation during a read or a write cycle, the word-line-select circuit 184 generates the $\overline{RDL}_{EVEN}$ and $\overline{RDL}_{ODD}$ signals in response to the $\overline{EO}_{EVEN}$, $\overline{EO}_{ODD}$, and $\overline{BS}$ signals. Thus, if the corresponding memory block 14 is selected and the addressed row is even, then $\overline{RDL}_{EVEN}$ is a logic 0 and $\overline{RDL}_{ODD}$ is a logic 1. Conversely, if the corresponding memory block 14 is selected and an odd row is addressed, then $\overline{RDL}_{EVEN}$ is a logic 1 and $\overline{RDL}_{ODD}$ is a logic 0. The circuit 184 also generates the BS signal as the complement of the $\overline{BS}$ signal. The circuit 184 is further described below in conjunction with FIG. 12.

In operation during a write or a read cycle, while the MWL signal is active high and the $\overline{WLLOF}$ signal is active low, the local word-line driver 200 that is associated with the addressed row generates the $LWL_{EVEN}$ and $LWL_{ODD}$ signals from the $\overline{RDL}_{EVEN}$ and $\overline{RDL}_{ODD}$ signals respectively. For example, if the addressed row is even, the circuit 200 generates a logic 1 for the $LWL_{EVEN}$ signal and a logic 0 for the $LWL_{ODD}$ signal. Conversely, if the addressed row is odd, then the circuit 200 generates a logic 0 for the $LWL_{EVEN}$ signal and a logic 0 for the $LWL_{ODD}$ signal. The circuit 200 is further described below in conjunction with FIG. 13.

In operation during write and read cycles and single-bit- and stress-test modes, the test-mode logic circuit 218 generates the SBT, $\overline{FONB}$, FOFFED, AONEO, and $\overline{AOPEO}$ signals as described above. The circuit 218 is further discussed below in conjunction with FIG. 14.

Referring to FIGS. 2 and 3, in summary during a write or read cycle, the R/W circuitry 24 accesses the BLC and BLT lines coupled to the addressed memory cell or cells to allow data transfer thereto or therefrom, and the row-address circuitry 126 activates the word line or lines of the addressed memory cell or cells. In summary during a single-bit test mode, the R/W circuitry 24 and the row-address circuitry 126 have inventive structures that perform inventive functions to electrically isolate and allow testing of a single memory cell.

Figure 4:
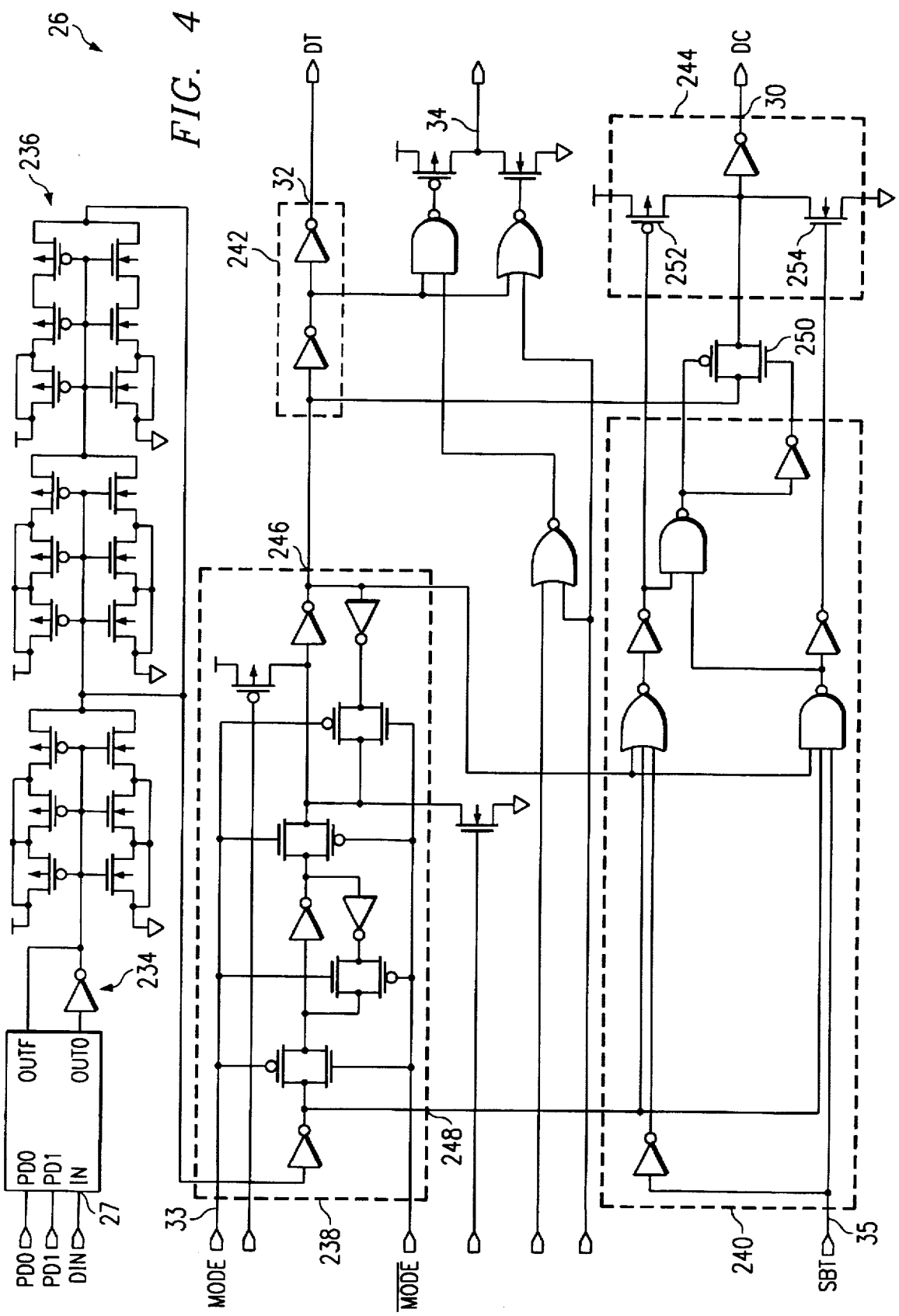
FIG. 4 is a schematic diagram of one embodiment of the data input buffer of FIG. 2.

FIG. 4 is a schematic diagram of one embodiment of the data input buffer 26 of FIG. 2. As shown, the data input buffer 26 includes input circuitry 234, delay circuitry 236, a memory circuit, i.e., latch 238, a test circuit 240, a first driver 242, and a second driver 244. As shown, the input circuitry 234 receives the data signal and couples it via the delay circuit 236 to the latch 238. The latch 238 has an output terminal 246, which couples the data to both the input terminals of the drivers 242 and 244. The driver 242 has an even number (here two) of inverters, and the driver 244 has an odd number (here one) of inverters. The latch 238 has a second output terminal 248 that couples the data to the test circuit 240.

In operation during a write or read cycle, the latch 238 couples the data signal to the input of the driver 242 and to the input of the driver 244 via the switch 250, which is closed, ie., conducting. Both the transistors 252 and 254 of the driver 244 are open, i.e., nonconducting, such that the data from the latch 238 is coupled via the switch 250 directly to the driver 244. The driver 244 generates DC complementary to the data signal, and the driver 242 generates DT equal to the data signal.

During a single-bit-test mode, while an active high SBT signal is coupled to the test-mode terminal 29, the test circuit 240 opens the switch 250 and controls the state of DC via the transistors 252 and 254. The latch 238 receives MODE, here separated into complementary signals MODE and $\overline{MODE}$.

During a first period of time, MODE is a logic 0, and first data signal is applied to the input 27 and propagates through to the output terminal 246 of the latch 238 and to the driver 242. Next, to begin a second period of time, MODE transitions to a logic 1. After this transition, the latch 238 stores the value of the data signal that appeared at the terminal 27 during the first period of time, and couples this stored data signal to the driver 242 as well as to one of the inputs of the test circuit 240. A second data signal then drives the input terminal 27 and is coupled via the latch 238 to the test circuit 240. Depending upon the values of the first and second data signals, the test circuit 240 causes the driver 244 to provide the desired logic level for DC. Thus, the test circuit 240 allows the data input buffer 26 to generate the DC and DT signals having a same or different logic levels during the single-bit test mode. Following is a table that shows the various combinations of DC and DT that the data input buffer 26 can generate.

| Level of MODE During First Time Period | Level of MODE During The Second Period | DT | DC | Test Mode Operation |
|---|---|---|---|---|
| 0 | 0 | 0 | 0 | Both BLC and BLT of the selected memory cell are at logic 0 (i.e., the write driver 38 (FIG. 2) receiving DC and DT uncouples WDPC and WDPT from WBC and WBT respectively, and couples both WBC and WBT to ground) |
| 0 | 1 | 0 | 1 | BLC is coupled via WBC to WDPC, BLT is coupled to ground |
| 1 | 0 | 1 | 0 | BLC is coupled to ground, BLT is coupled via WBT to WDPT |
| 1 | 1 | 1 | 1 | BLC and BLT are respectively coupled via WBC and WBT to WDPC and WDPT |

Still referring to FIG. 4, the data input buffer 26 allows, during a single-bit-test mode, a single memory cell to be electrically isolated from other circuitry and an external testing device to provide test signals to the cell. By placing probes on the WDPC and WDPT lines 43 and 45 (FIG. 2), and driving DT and DC according to the above table, the testing device can measure the characteristics of the cell with either one or both of the BLC and BLT lines coupled to the testing device. Such a complete test mode would be impossible with conventional data input buffers because such buffers cannot drive the DC and DT signals to the same logic level using a single data pin 18. Memory devices having conventional data input buffers would require additional externally accessible testing pins, which would increase the layout areas of such memory devices. As discussed above in FIG. 2, when both the DC and DT signals are logic 0, the write driver 38 respectively uncouples the WDPC and WDPT lines 43 and 45 from the WBC and WBT lines 56 and 58. Also as discussed above, the WBC and WBT lines associated with the 28 unselected memory blocks 14 are uncoupled by virtue of the $\overline{BSBT}$ signal. There are, however, four selected blocks 14 that account for the 32 data bits D(x). Thus, for all but the single memory cell under test, the respective data pins 18 are driven in accordance with the above table such that all the associated input buffers 26 generate a logic 0 for both DC and DT. The data input buffer 26 also includes circuitry that is shown in FIG. 4 but not described because such circuitry is unrelated to the inventive circuitry and procedures discussed herein. It is also understood that various modifications can be made to the data input buffer 26 without departing from the inventive concept. For example, the driver 244 can be designed so as to receive only a single control signal from the test circuit 240. Also, the delay circuit 236 may be omitted. Furthermore, although FIG. 4 shows specific logic circuits that compose the drivers 242 and 244, latch 238, and test circuit 240, other logic circuits may be used to perform the inventive functions.

Figure 5:
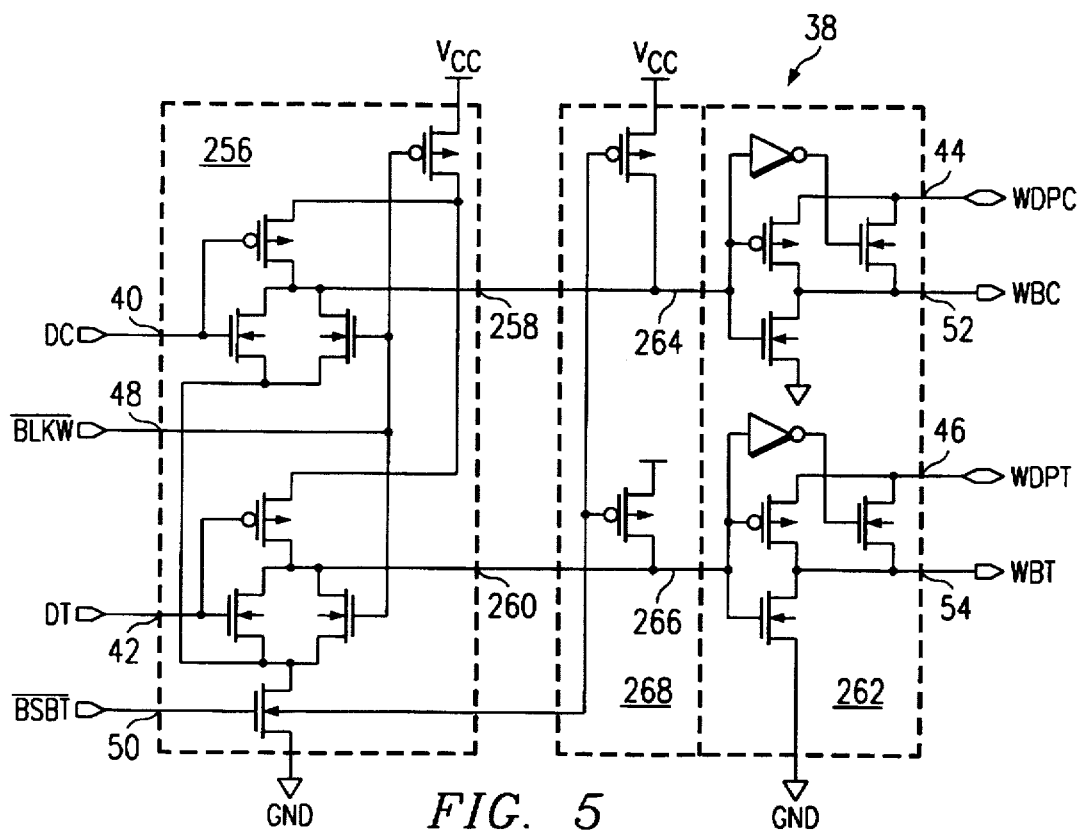
FIG. 5 is schematic diagram of one embodiment of the write driver circuit of FIG. 2.

FIG. 5 is a schematic diagram of one embodiment of the write driver 38 of FIG. 2. An input stage 256 has four terminals respectively coupled to the input terminals 40, 42, 48, and 50, and has two output terminals 258 and 260. The input stage 256 is coupled to a power-supply voltage Vcc via a first power-supply terminal and to ground via a second power-supply terminal. An output stage 262 has a pair of input terminals 264 and 266, which are respectively coupled to the output terminals 258 and 260 of the input stage 256. The output stage 262 has write-complement and write-true power terminals respectively coupled to the terminals 44 and 46 of the write driver 38, and two output terminals respectively coupled to the output terminals 52 and 54. A test-mode stage 268 has an input terminal coupled to the input terminal 50 and has a pair of output terminals respectively coupled to enable terminals of the output stage 262. In the illustrated embodiment of the write driver 38, the enable terminals are the input terminals 264 and 266.

In operation during a write cycle, $\overline{BSBT}$ is inactive high and $\overline{BLKW}$ is active low. Thus, both the input and output stages 256 and 262 are enabled such that the output circuit 262 drives the terminals 52 and 54, and thus the WBC and WBT lines 56 and 58, with the proper logic levels for WBC and WBT to write the input data value into the addressed memory cell. For example, if DC is a logic 0 and DT is a logic 1 a data value of logic 1, then the output circuit 262 generates a logic 0 for WBC and a logic 1 for WBT.

During a read cycle, $\overline{BSBT}$ and $\overline{BLKW}$ are both inactive high. The output stage 262 drives both WBC and WBT to a logic 1, regardless of the logic levels of the signals DC and DT, by respectively coupling the terminals 52 and 54 to the WDPC and WDPT lines.

During a single-bit-test mode, the $\overline{BSBT}$ signals are active low for all of the write drivers 38 that are associated with the unselected memory blocks 14. In response to such an active-low level, the test stage 268 causes the output stage 262 to respectively uncouple the terminals 52 and 54 from the WDPC and WDPT lines 43 and 45, and to couple the terminals 52 and 54 to ground. As stated above, by respectively uncoupling the terminals 52 and 54, and thus the WBC and WBT lines 56 and 58, from the WDPC and WDPT lines 43 and 45, associated parasitic components, leakage currents, and function effects are also uncoupled from the WDPC and WDPT lines 43 and 45 and thus from the memory cell selected for testing. Thus, the testing device can obtain more accurate test measurements from the selected memory cell. As discussed above in conjunction with FIG. 4, for all of the write drivers 38 that are to be unselected, but that are associated with a selected block 14, $\overline{BSBT}$ is inactive high, $\overline{BLKW}$ is active low, and both the signals DC and DT are driven to a logic 0 by the data input buffer 26 (FIG. 4) so as to force the output stage 262 to respectively uncouple the WDPC and WDPT lines 43 and 45 from the terminals 52 and 54. Thus, as stated above, the only WBC and WBT lines 56 and 58 that are respectively coupled to the WDPC and WDPT lines 43 and 45 are those that are coupled to the BLC and BLT lines of the selected memory cell.

Although FIG. 5 illustrates a specific circuit, the write driver 38 may include other circuit arrangements to provide the same advantages as discussed above.

Figure 6:
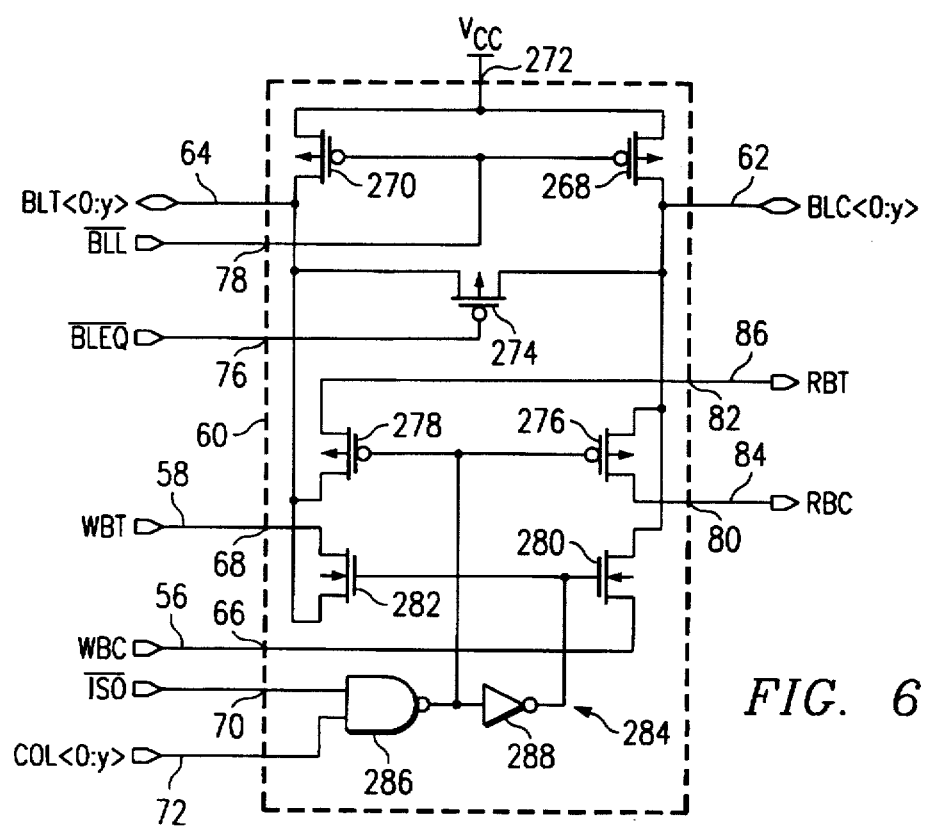
FIG. 6 is a schematic diagram of one embodiment of the column-select circuit of FIG. 2.

FIG. 6 is a schematic diagram of one embodiment of the column-select circuit 60 of FIG. 2. For clarity, a single circuit is shown that is associated with a single pair of BLC and BLT lines from BLC <0:Y> and BLT <0:Y>, it being understood that similar circuits are included for the remaining Y pairs of BLC and BLT lines. The circuit 60 includes a pair of loads, here transistors 268 and 270, which, when activated, couple the associated BLC and BLT lines to the power-supply voltage Vcc via a power-supply terminal 272. An equilibrate switch, here a transistor 274, is coupled between the BLC and BLT lines. A pair of read gates, here transistors 276 and 278, are respectively coupled between the BLC and BLTC lines and the RBC and RBT lines 84 and 86. A pair of write gates, here transistors 280 and 282, respectively couple the BLC and BLT lines to the WBC and WBT lines 56 and 58 via the terminals 66 and 68. A control, i.e., column-activate, circuit 284, which includes a NAND gate 286 and an inverter 288, receives from terminal 70 $\overline{ISO}$, and receives from the column-select bus the column-select line that is associated with the column comprising the pair of BLT and BLC lines. For example, in one aspect of the invention, Y=15, and there are 16 BLC/BLT line pairs that can be coupled to WBC and WBT lines 56 and 58. Thus, the portion of the circuit 60 shown in FIG. 6 is replicated 16 times, one portion for each BLT/BLC pair. Each of these 16 portions is coupled to a different one of the 16 lines that form the column-select bus. Thus, when a particular memory cell is to be either read from or written to, the column-select line associated with the corresponding BLT/BLC line pair carries an active level to couple the BLC and BLT lines to the appropriate read (RBC and RBT) or write (WBC and WBT) lines as is further discussed below.

In operation, before either a write or read cycle, $\overline{BLEQ}$ and $\overline{BLL}$ are active low to respectively equilibrate the associated BLT and BLC lines and pull them up to approximately Vcc. Before the beginning of a write or read cycle, $\overline{BLL}$ and $\overline{BLEQ}$ go inactive high. During a write or read cycle, the $\overline{ISO}$ goes inactive high and the column-select signal goes active high and cause both the read transistors 276 and 278 and the write transistors 280 and 282 to become conductive. Thus, as discussed above, such a circuit structure eliminates the need for separate passgates for the read circuit 88 (FIG. 2), which is coupled to the RBC and RBT lines 84 and 86. Such separate pass gates often degrade the signal from a memory cell during a read cycle. Thus, the column-select circuit 60 provides reduced read-signal degradation. During a write cycle, $\overline{ISO}$ remains in active high. However, $\overline{ISO}$ remains inactive high only for an initial period of a read cycle, and then goes inactive low to disable, i.e., make nonconductive, all of the transistors 276, 278, 280 and 282. As discussed above, this action uncouples the read circuit 88 from the BLT and BLC lines after it has sensed enough of the data value stored in the memory cell such that it can attain its steady-state value. This uncoupling allows the read circuit 88 to read the data more quickly because it removes the parasitic capacitances associated with the BLT and BLC lines (and also the WBT and WBC lines 58 and 56 that are coupled to the read circuit 88 via the passgates 280 and 282) from the inputs of the read circuit 88.

Although a specific circuit is shown for the column-select circuit 60, it is understood that other similar circuitry may be used to obtain the same advantages. For example, the P-channel transistors may be N-channel, and the N-channel transistors may be P-channel. Furthermore, a gate other than the NAND gate 286 may be used to form the column-activate circuit 284.

Figure 7:
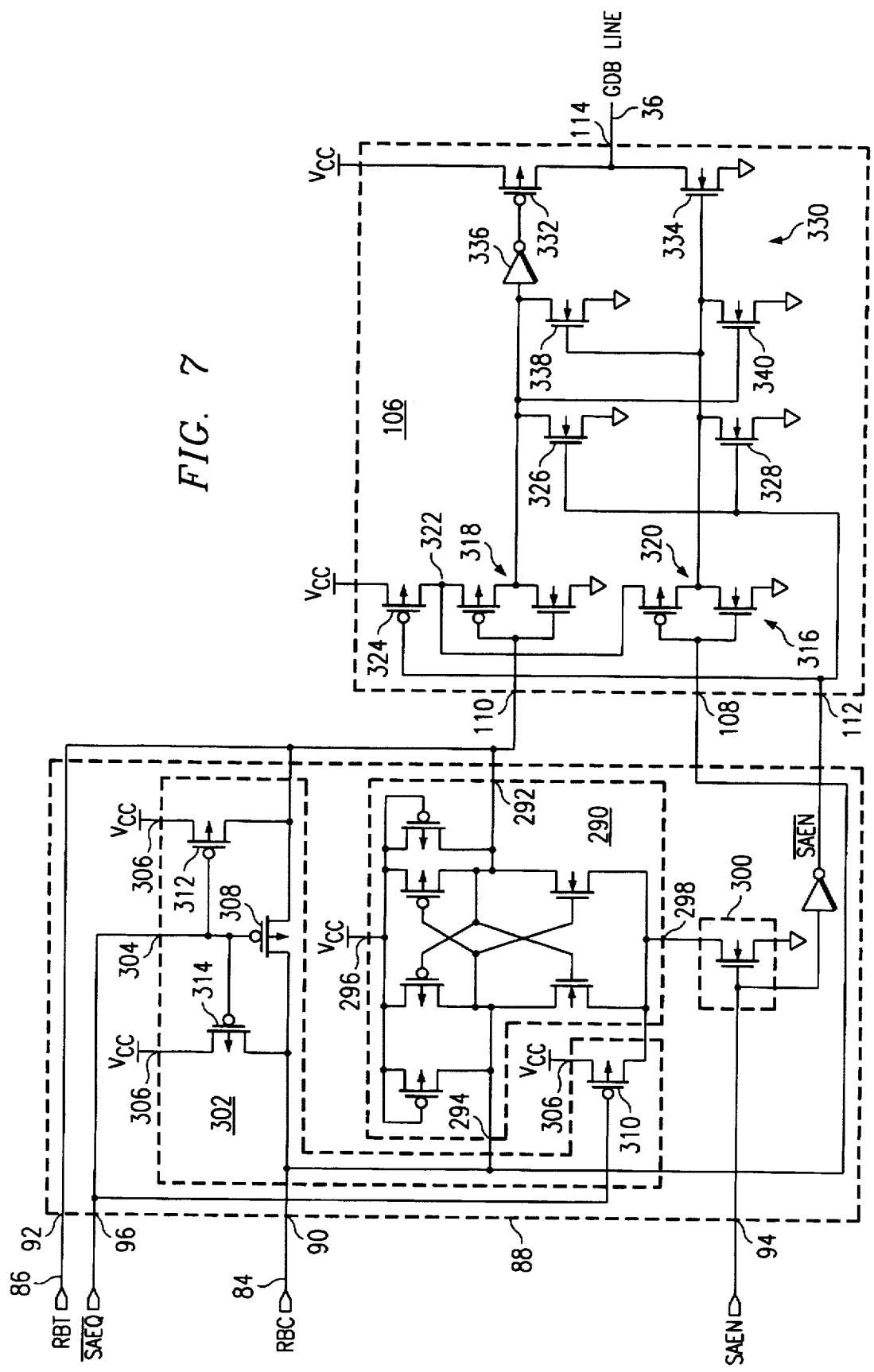
FIG. 7 is a schematic diagram of one embodiment of the read circuit and the line driver circuit of FIG. 2.

FIG. 7 is a schematic diagram of the read circuit 88 and the data-line driver 106 of FIG. 2.

The read circuit 88 includes a sense amplifier 290, which has a first input terminal 292 coupled to the RBT line 86, and a second input terminal 294 coupled to the RBC line 84. The sense amplifier 290 includes a first power terminal 296 coupled to Vcc, and a second power terminal 298. An enable circuit 300, which here includes a transistor, has a control terminal coupled to SAEN via the input terminal 94, and has a pair of switch terminals coupled between the power terminal 298 and ground. An equilibrate circuit 302 has an equilibrate terminal 304 coupled to $\overline{SAEQ}$ via the terminal 96. The equilibrate circuit 302 is also coupled to Vcc via a power-supply terminal 306. The equilibrate circuit 302 includes a first equilibrate switch 308, which has a control terminal coupled to $\overline{SAEQ}$ and a switchable path coupled between the RBC line 84 and the RBT line 86. A second equilibration switch 310 has a control terminal coupled to $\overline{SAEQ}$ and a switchable path coupled between Vcc and the second power terminal 298 of the sense amplifier 290. A third equilibration switch 312 has a control terminal coupled to $\overline{SAEQ}$ and a switchable path coupled between Vcc and the RBT line 86. A fourth equilibration switch 314 has a control terminal coupled to $\overline{SAEQ}$ and a switchable path coupled between Vcc and the RBC line 84.

In operation, before either a write or a read cycle, $\overline{SAEQ}$ is active low to cause the equilibrate circuit 302 to equilibrate the sense amplifier 90 by coupling together and to Vcc the RBC and RBT lines 84 and 86.

At the beginning of a read cycle, $\overline{SAEQ}$ goes inactive high to cease the precharging of the sense amplifier 290, and SAEN goes active high to enable the sense amplifier 290 by coupling the power terminal 298 to ground. The sense amplifier 290 then amplifies the data signals initially occupying the RBC and RBT lines 84 and 86 to give full-signal data values on these lines. For example, depending upon the value of data stored in the memory cell that is read, the sense amplifier 290 drives one of the RBC and RBT lines 84 and 86 to a logic 0, and the other of the RBT and RBC lines 84 and 86 to a logic 1. The amplified data value is coupled to the data-line driver 106 via the RBC and RBT lines 84 and 86.

As stated above, during a write cycle, known read circuits often draw supply current from the power supply even when the sense amplifier 290 is disabled. For example, referring to FIG. 6, during a write cycle, the transistors 276 and 278 are conducting, thereby coupling the RBC and RBT lines 84 and 86 to the BLT and BLC lines. Thus, one of the lines 84 and 86 will be coupled to a logic 1, i.e., Vcc, and the other line 84 and 86 will be coupled to ground. However, because the transistors 276 and 278 are P-channel, the line 84 and 86 that is coupled to ground will actually be at one transistor threshold above ground. In one embodiment of the invention, a transistor threshold is approximately 1.5 volts, which is a body-effected threshold value.

Referring to FIG. 7, in known read circuits, the switch 310 has its control terminal coupled to SAEN. With such a configuration, and with Vcc coupled to one of the lines 84 and 86 and approximately 1.5 volts coupled to the other of the lines 84 and 86, the sense amplifier 290 may draw a supply current through the switch 310 and through the one of the cross-coupled N-channel transistors having its gate coupled to the line 84 and 86 carrying Vcc. Furthermore, in known read circuits, $\overline{SAEQ}$ is normally active low during a write cycle to maintain the sense amplifier 290 in an equilibrated state.

Still referring to FIG. 7, the read circuit 88, and more specifically the sense amplifier 290, draws substantially no current from the power supply during a write cycle in which the memory block 14 associated with the sense amplifier 290 is selected. As state above, Vcc occupies one of the lines 84 and 86, and a body-effected transistor threshold voltage occupies the other of the lines 84 and 86. In order to cause the sense amplifier 290 to draw substantially no current from the power supply, $\overline{SAEQ}$ is active high both during read and write cycles. In one embodiment of the invention, $\overline{SAEQ}$ is only driven to an active low level when the memory block 14 that the read circuit 88 is associated with is unselected. Furthermore, the switch 310 has its control terminal coupled to $\overline{SAEQ}$ instead of SAEN. Thus, during a write cycle with $\overline{SAEQ}$ in active high and SAEN in active low, the power terminal 298 of the sense amplifier 290 is uncoupled from both Vcc and ground. Therefore, neither of the cross-coupled N-channel transistors of the sense amplifier 290 can allow a current to flow between Vcc and the line 84 or 86 that carries the body-effected transistor threshold voltage.

Still referring to FIG. 7, the data-line driver 106 includes an input stage 316, which includes a first pair of totem-pole coupled transistors 318, which have their gates coupled to the RBT line 86 via the input terminal 110. The input stage 316 also includes a second pair of totem-pole coupled transistors 320, which have their gates coupled to the RBC line 84 via the input terminal 108. Each transistor pair 318 and 320 is coupled between ground and a power-distribution node 322. An enable circuit, which here comprises a switch 324, has a control terminal coupled to $\overline{SAEN}$ via the enable terminal 112, and has a switchable path coupled between Vcc and the power-distribution node 322. The enable circuit may also include a first switch 326 having its control terminal coupled to $\overline{SAEN}$ and having a switchable path coupled between the output terminal of the transistor pair 318 and ground, and a second switch 328 having its control terminal coupled to $\overline{SAEN}$ and a switchable path coupled between the output terminal of the transistor pair 320 and ground. An output stage 330 includes a pair of output drive transistors 332 and 334, and has a first input terminal that is coupled to the output terminal of the transistor pair 318. The first input terminal is coupled via an inverter 336 to the gate of the transistor 332. The transistor 332 has a switchable path coupled between Vcc and the GDB line 36. The output stage includes a second input terminal that is coupled to the output terminal of the transistor pair 320. The second input terminal is coupled directly to the gate of the drive transistor 334, which has a switchable path coupled between the GDB line 36 and ground. The output stage may also include transistors 338 and 340 coupled as shown.

In operation during a read cycle, $\overline{SAEN}$ is active low, thus forcing the enable circuit to couple Vcc to the power-distribution node 322 via the transistor 324. Thus, the input stage 316 receives the logic levels on the RBC and RBT lines 84 and 86, amplifies these levels, and couples these amplified levels to the output stage 330. The output stage 330 drives the GDB line 36 with the proper data value that the read circuit 88 read from the addressed memory cell and amplified.

As stated above, in operation during a write cycle, known driver circuits, which typically lack an enable circuit, sometimes allow the driver 106 to draw a supply current. For example, during a write cycle where the memory block 14 associated with the circuit 106 is selected, one of the lines 84 and 86 carries logic 1 and the other carries a body-effected threshold voltage, which as stated above is approximately 1.5 volts in one embodiment of the invention. Such a threshold voltage applied to either of the transistor pairs 318 and 320 causes the transistors of that pair to become partially active, thus drawing a current, often called a "crowbar" current, from Vcc. Furthermore, it is sometimes desirable during initial testing and burn-in of the memory device 10 to simultaneously write to all memory locations with a Vcc voltage of approximately 9 volts instead of the normal operating Vcc voltage of between 3 and 5 volts. Thus, because of the higher Vcc, during a burn-in mode the total crowbar current drawn by all of the data-line drivers 106 in the R/W circuit 24 can be relatively large.

Fortunately, the structure of the data-line driver 106 substantially eliminates crowbar currents such that the circuit 106 draws substantially no supply current during a write cycle when the circuit 106 is disabled. In operation during a write cycle, $\overline{SAEN}$ is inactive high. This inactive high level opens the switch 324, and thus uncouples both of the transistor pairs 318 and 320 from Vcc. Thus, regardless of the voltage level at the input terminals 108 and 110 of the driver 106, the nonconductive switch 324 prevents the transistor pairs 318 and 320 from drawing supply current. Also, the transistors 326 and 328 drive the input terminals of the output stage to the appropriate levels so that both drive transistors 332 and 334 are in a nonconducting state. Thus, the driver circuit 106 drives no signal onto the GDB line 36, i.e., the circuit 106 places the output terminal 114 in a high-impedance state. Thus, the circuit 106, when disabled, draws substantially no supply current regardless of the signal level that is present at its input terminals 108 and 110.

Figure 8:
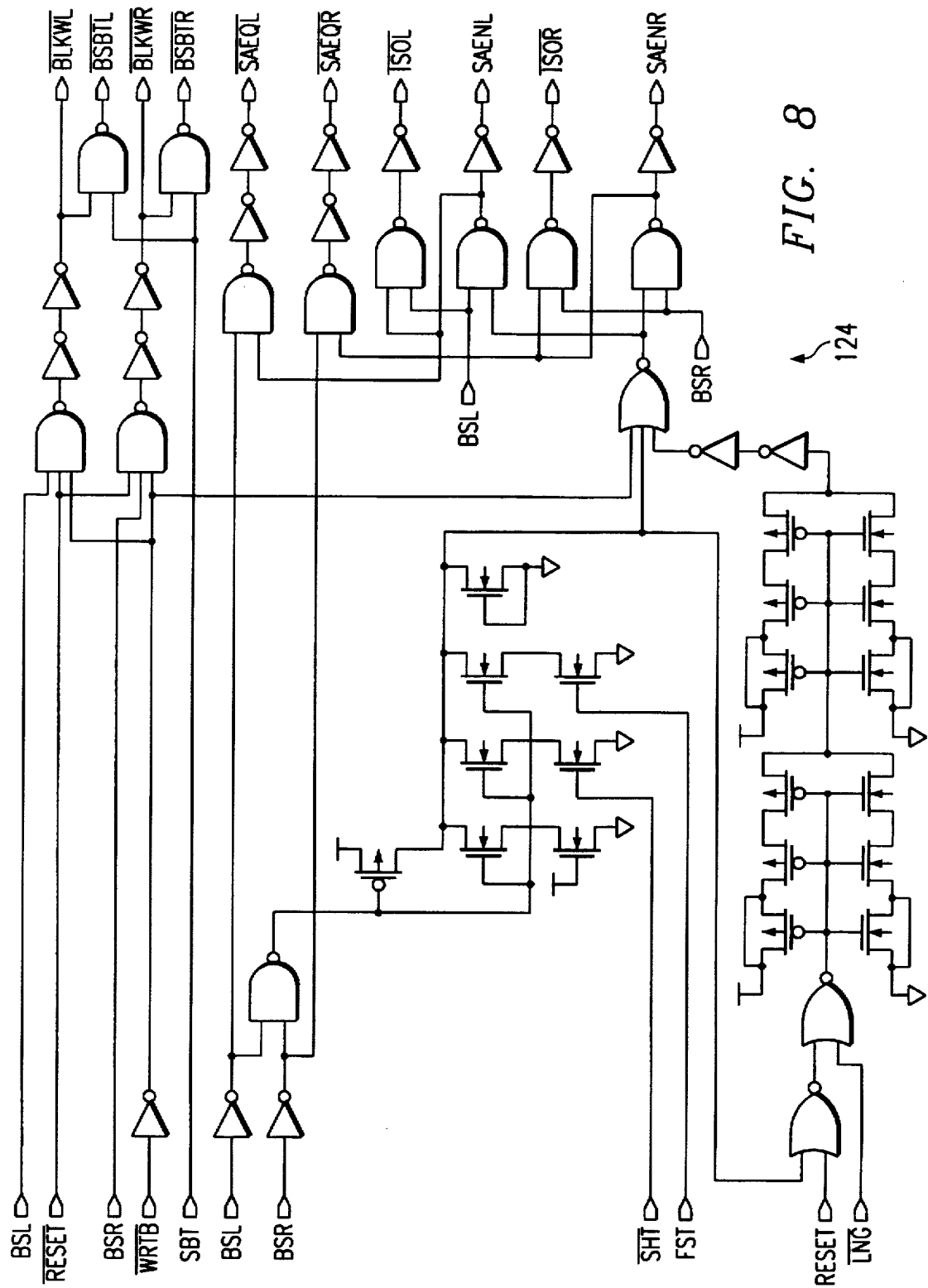
FIG. 8 is a schematic diagram of one embodiment of the block read/write control circuit of FIG. 2.

FIG. 8 is a schematic diagram of one embodiment of the block read/write control circuit 124 of FIG. 2. As stated above in conjunction with FIG. 2, in one embodiment of the invention, there is one circuit 124 for each memory block 14 (FIG. 1). In another embodiment shown in FIG. 8, the circuit 24 is constructed to service two memory blocks 14. In this embodiment, the circuit 124 generates one of each signal for each memory block 14. For example, the circuit 124 generates a block write left ($\overline{BLKWL}$) signal and a block write right ($\overline{BLKWR}$) signal, one for a first block 14, here called the left block, and the other for a second block 14, here called the right block. It is understood, however, that the circuitry for both embodiments of the block read/write control circuit 124 can be similar to that shown in FIG. 8.

The block 124 receives SBT, $\overline{WRTB}$, RESET, a block select left (BSL) signal, and a block select right (BSR) signal. The circuit 124 receives other signals that are ignored here for clarity. These other signals have little or no effect on the inventive concepts discussed herein.

As discussed above, the circuit 124 includes generates $\overline{BLKWL}$ active low when the left block is selected during a write cycle. Likewise, the circuit 124 generates an active low $\overline{BLKWR}$ when the right block is selected during a write cycle. The circuit 124 generates an active low level for the $\overline{BSBTL}$ and $\overline{BSBTR}$ signals during the single-bit test mode when the left and right blocks 14 are respectively unselected.

The circuit 24 generates an inactive high level for $\overline{SAEQL}$ whenever the left block 14 is selected either during a read cycle, a write cycle, or any other cycle. The circuit 24 generates an active low level for $\overline{SAEQL}$ under certain conditions when the left block 14 is unselected.

The circuit 24 generates an active low signal level for $\overline{ISOL}$ whenever the left block 14 is unselected. The circuit 24 generates an inactive high level for $\overline{ISOL}$ whenever the left block 14 is selected during a write cycle, and during an initial portion of a read cycle when the left block 14 is selected as discussed above in conjunction with FIG. 6. As shown, $\overline{ISOL}$ is a direct function of BSL.

The circuit 124 generates an active high level for SAENL whenever the left block 14 is selected during the latter portion of a read cycle as discussed above in conjunction with FIG. 6. Thus, in one embodiment of the invention, the circuit 124 drives $\overline{ISOL}$ active low and SAENL active high substantially simultaneously. Thus, the sense amplifier 290 is disabled until it is both initially charged with the data value from the addressed memory cell and uncoupled from that memory cell.

The operation of the circuit 124 is described with reference to the signals for the left block 14, it being understood that the signals for the right block 14 are generated in a similar manner. Furthermore, although shown comprising specific logic and other circuits, the circuit 24 can comprise other circuits that generate the signals as described above.

Figure 9:
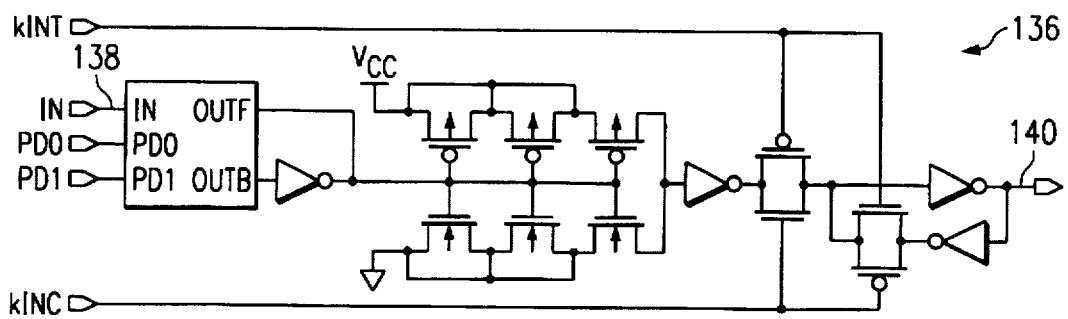
FIG. 9 is a schematic diagram of one embodiment of the address input buffer of FIG. 3.

FIG. 9 is a schematic diagram of one embodiment of the address input buffer 136 of FIG. 3. The buffer 136 receives the odd/even address bit at the input terminal 138 and provides the buffered odd/even address bit at the output terminal 140.

Figure 10:
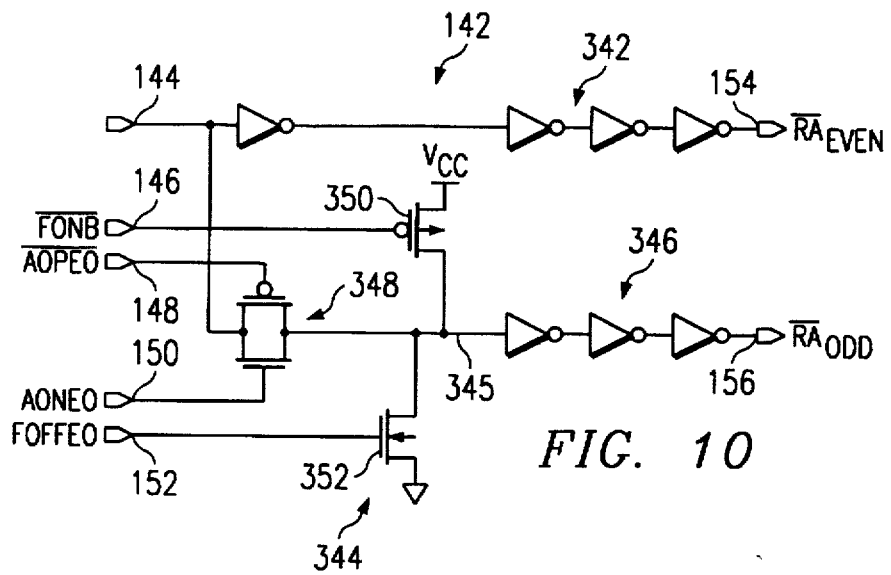
FIG. 10 is a schematic diagram of one embodiment of the even/odd-row selection circuit of FIG. 3.

FIG. 10 is a schematic diagram of one embodiment of the even/odd-memory-row selector 142 of FIG. 3. A first stage 342 includes an even number (here four) inverters that are serially coupled between the address input terminal 144 and the row-address-even terminal 154. A mode-selection stage 344 has a number of mode-select input terminals coupled to the mode terminals 146, 148, 150 and 152, an input terminal coupled to the input terminal 144, and an output terminal 345. The mode-selection stage 344 includes switches 348, 350, and 352, which are coupled as shown. A second stage 346 includes an odd number (here 3) of inverters that are serially coupled between the output terminal 345 and the row-address-odd terminal 156.

In operation during a write or read cycle, the switch 348 is conducting, thus coupling the address bit at the terminal 144 to the stage 346. The switches 350 and 352 are nonconducting. If the address bit at the input terminal 144 indicates that an even row is to be accessed, i.e., the address bit is a logic 0, then the stage 342 generates an active logic 0 for $\overline{RA}_{EVEN}$, and the stage 346 generates an inactive logic 1 for $\overline{RA}_{ODD}$. Thus, the addressed even row is selected, and all the remaining even rows and all the odd rows of memory cells in the memory blocks 14 are unselected. Conversely, if the address bit at the input terminal 144 is a logic 1 to indicate that an odd row is to be accessed, then the stage 342 drives $\overline{RA}_{EVEN}$ to an inactive logic 1, and the stage 346 drives $\overline{RA}_{ODD}$ to an active logic 0. Thus, the addressed odd row is selected and the remaining odd rows and all the even rows of memory cells in the blocks 14 are unselected.

As discussed above in conjunction with FIG. 3, during a single-bit-test mode, it is sometimes desirable that the BLC and BLT lines of memory cell be driven with signals without the word line of the memory cell being activated. In such a situation, the address bit at terminal 144 is driven to a logic 1 to the drive $\overline{RA}_{EVEN}$ to an inactive logic 1. In response to an inactive logic 1 for $\overline{OE}$, $\overline{FONB}$ and $\overline{AOPEO}$ are driven to an inactive logic 1, AONEO is driven to an inactive logic 0, and FOFFEO is driven to an active logic 1. Thus, the switches 350 and 348 are nonconducting, and the switch 352, which is conducting, drives the output terminal 345 to a logic 0. This logic 0 at the output terminal 345 causes the stage 346 to generate an inactive logic 1 for $\overline{RA}_{ODD}$. Thus, during the single-bit test mode, no rows of memory cells are selected, even the row that includes the memory cell under test.

During the burn-in mode, it is often desirable to select all rows of memory cells, both even and odd, simultaneously. The address bit at the terminal 144 is driven to a logic 0, and the stage 342 generates an active logic 0 for $\overline{RA}_{EVEN}$ $\overline{AOPEO}$ is driven to an inactive logic 1, AONEO is driven to an inactive logic 0, FOFFEO is driven to an inactive logic 0, and $\overline{FONB}$ is driven to an active logic 0. Thus, the switches 348 and 352 are nonconducting, and the switch 350, which is conducting, couples Vcc to the terminal 345. Thus, the stage 346 generates an active logic 0 for $\overline{RA}_{ODD}$. Thus, both odd and even rows of memory cells in the memory blocks 14 can be simultaneously selected.

Thus, the mode-select stage 344 allows the even/odd-memory-row selector 142 to drive both $\overline{RA}_{EVEN}$ and $\overline{RA}_{ODD}$ to the same logic level, whether that logical level be active to simultaneously select an odd and an even row, or inactive so as to select no rows. It is understood that modifications may be made to the circuit 142 without affecting the inventive features thereof.

Figure 11:
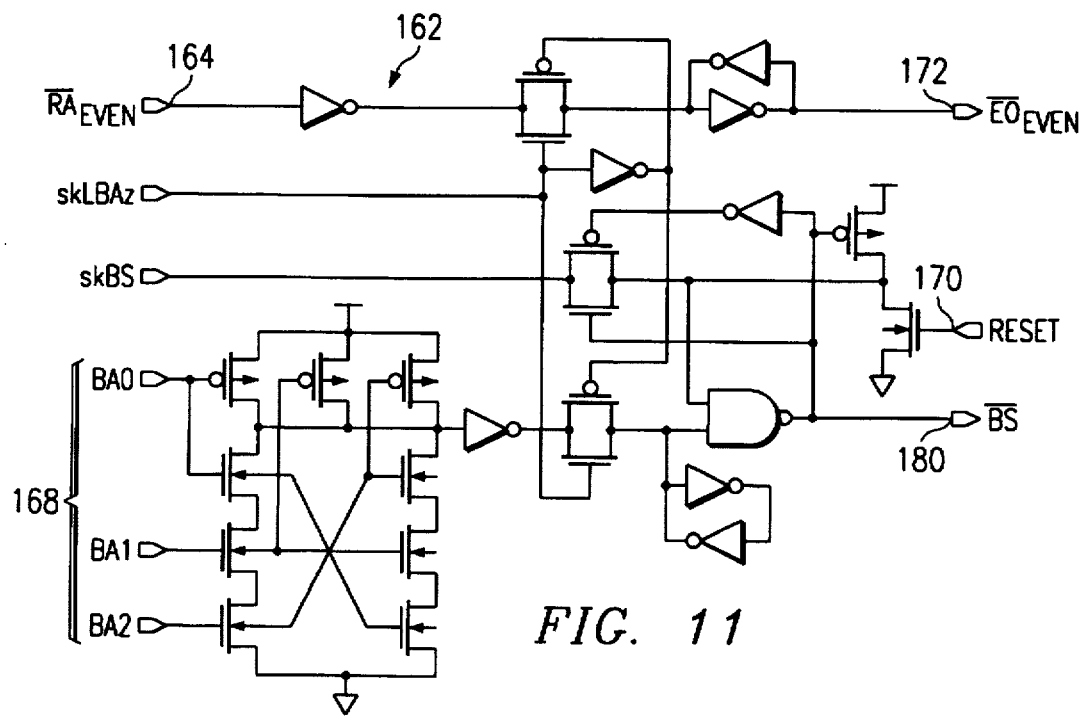
FIG. 11 is a schematic diagram of one embodiment of the word-line and block select circuit of FIG. 3.

FIG. 11 is a schematic diagram of the word-line-and-block-select circuit 162 of FIG. 3. Only the portion that generates the $\overline{EO}_{EVEN}$ signal is shown, it being understood that the portion generating the $\overline{EO}_{ODD}$ signal is similar in construction and in operation.

In operation, the circuit 162 receives $\overline{RA}_{EVEN}$ at the terminal 164, and generates $\overline{EO}_{EVEN}$ at the terminal 172. The circuit 162 also receives three block-address signals 168 and generates therefrom $\overline{BS}$ at the terminal 180. In one embodiment of the invention, there is one circuit 162 for every two memory blocks 14. $\overline{EO}_{EVEN}$ and $\overline{EO}_{ODD}$ are common to all the memory blocks 14, and are generated by multiple circuits 162 in order to prevent problems such as excessive fan out. Furthermore, in the embodiment of the memory device 10 where four (out of 32) memory blocks 14 are accessed at a time, only eight $\overline{BS}$ signals need be generated. Thus, each of these 8 $\overline{BS}$ signals are coupled to a corresponding memory block 14 in each of the quadrants 12.

Figure 12:
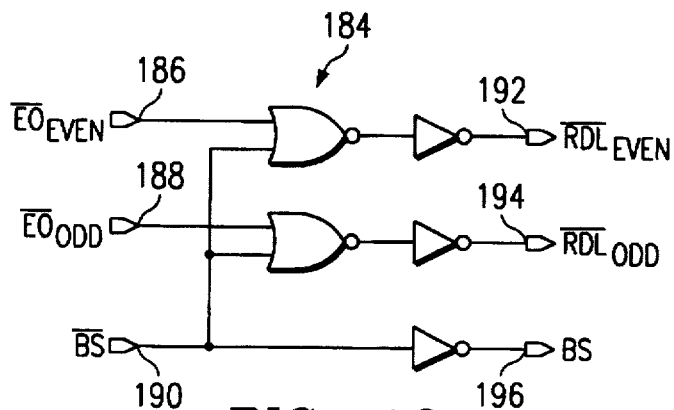
FIG. 12 is a schematic diagram of one embodiment of the word-line selection circuit of FIG. 3.

FIG. 12 is a schematic diagram of one embodiment of the word-line-select circuit 184 of FIG. 3. In operation, the circuit 184 generates $\overline{RDL}_{EVEN}$ from $\overline{EO}_{EVEN}$, $\overline{RDL}_{ODD}$ from $\overline{EO}_{ODD}$, and BS from $\overline{BS}$. The signals BS from two circuits 184 are coupled to the block read/write control circuit 124 (FIGS. 2 and 8) as BSL and BSR, respectively.

Figure 13:
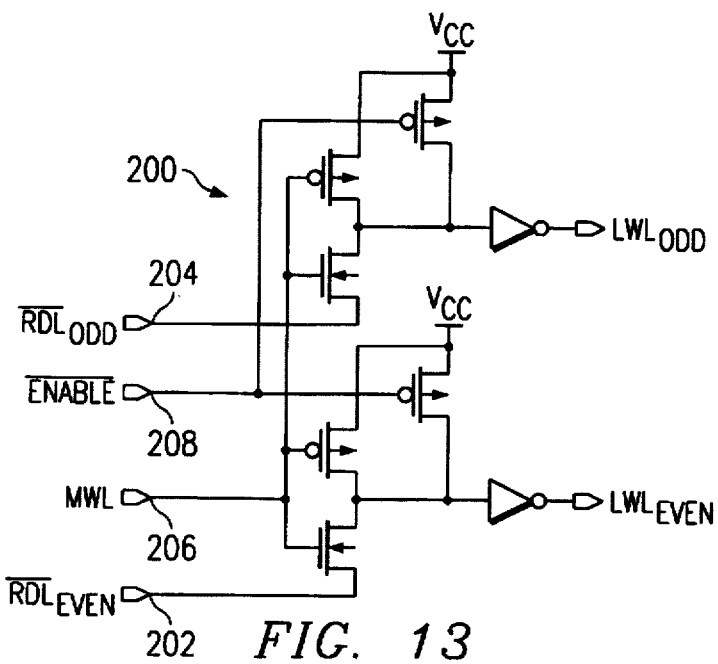
FIG. 13 is a schematic diagram of one embodiment of the local word-line driver circuit of FIG. 3.

FIG. 13 is a schematic diagram of one embodiment of the local word-line driver circuit 200 of FIG. 3. The circuit 200 generates an active logic 1 for $LWL_{ODD}$ when $\overline{RDL}_{ODD}$ is logic 0 and MWL and ENABLE are logic 1. Likewise, the circuit 200 generates an active logic 1 for $LWL_{EVEN}$ when $\overline{RDL}_{EVEN}$ is logic 0 and MWL and ENABLE are logic 1. As stated above, in one embodiment of the invention, each memory block 14 has 260 rows of memory cells. Therefore, in such an embodiment, there are 130 of the local word-line driver circuits 200 per memory block 14.

Figure 14:
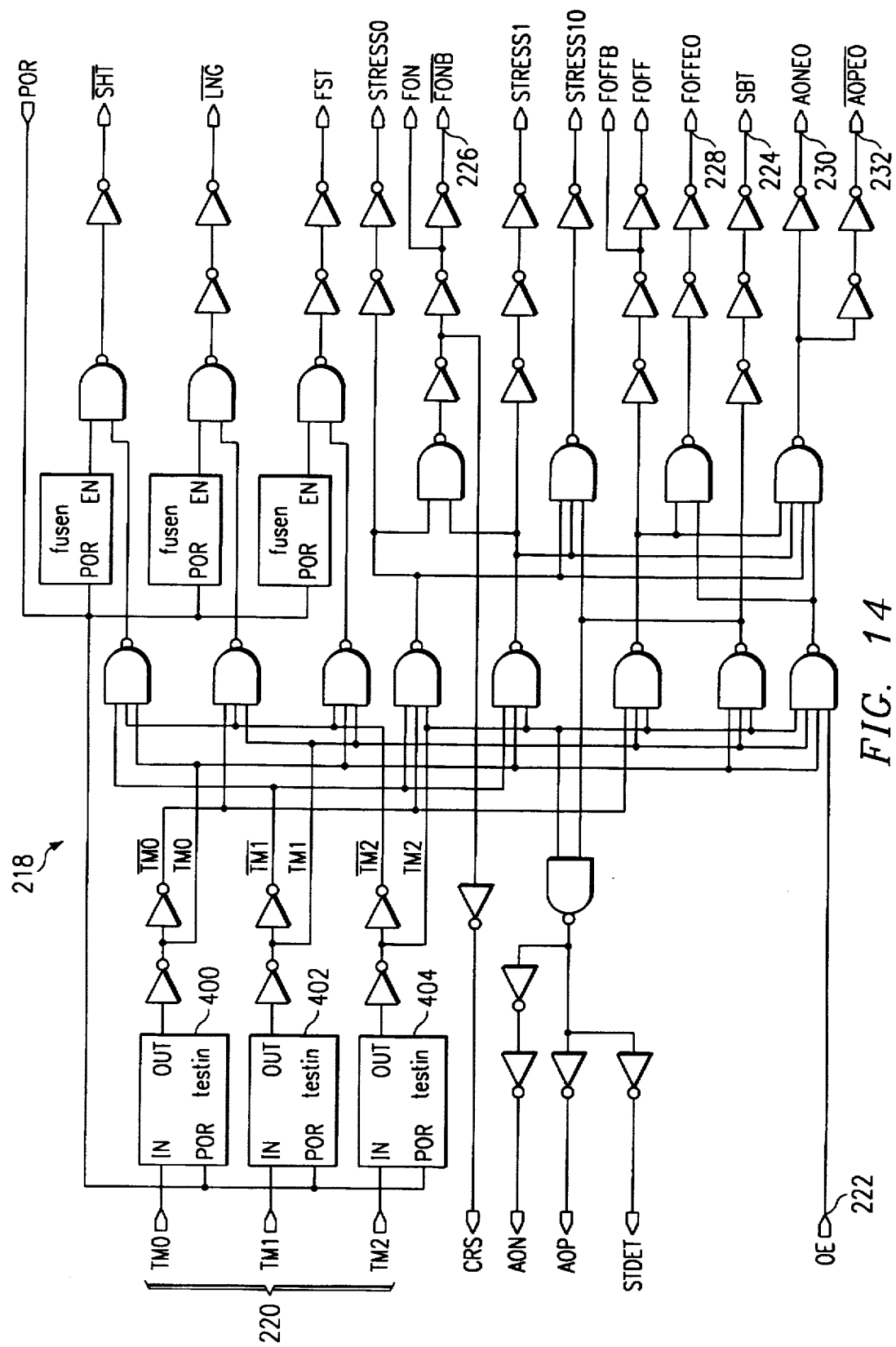
FIG. 14 is a schematic diagram of one embodiment of the mode logic circuit of FIG. 3.

FIG. 14 is a schematic diagram of one embodiment of the test-mode logic circuit 218 of FIG. 3. Note that the component blocks 400, 402, and 404 invert the respective TM, TM1, and TM2 signals, and FOFFEO, AONEO, and $\overline{AOPEO}$ are generated in part from $\overline{OE}$.

Figure 15:
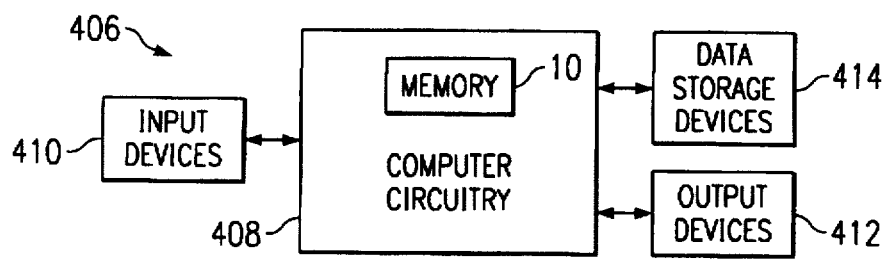
FIG. 15 is a block diagram of a computer system that incorporates the memory device of FIG. 1.

FIG. 15 is a block diagram of a computer system 406 that uses the memory device 10 of FIG. 1. The computer system 406 includes computer circuitry 408 for performing computer functions, such as executing software to perform desired calculations and tasks. The circuitry 408 typically includes a processor (not shown in FIG. 15) and the memory device 10 as shown. One or more input devices 410, such as a keypad or a mouse, are coupled to the computer circuitry 408 and allow an operator (not shown) to manually input data thereto. One or more output devices 412 are coupled to the computer circuitry 408 to provide to the operator data generated by the computer circuitry 408. Examples of output devices 412 include a printer and a video display unit. One or more data storage devices 414 are coupled to the computer circuitry 408 to store data on or retrieve data from external storage media (not shown). Examples of the storage devices 414 and the corresponding storage media includes drives that accept hard and floppy disks, tape cassettes, and compacts disc read-only memories (CD-ROMs). Typically, the computer circuitry 408 generates the address data and other control signals that the memory 10 receives.

Figure 16:
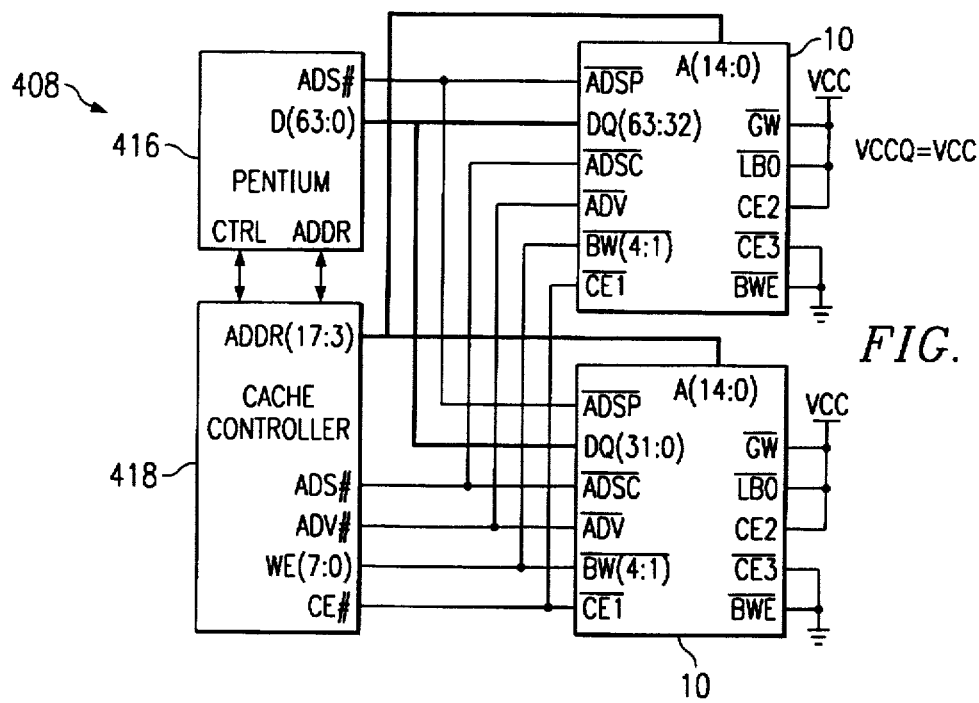
FIG. 16 is a block diagram of one embodiment of the computer circuitry of FIG. 15.

FIG. 16 is a block diagram of the computer circuitry 408 of FIG. 15 according to one embodiment of the invention. The circuitry 408 includes two memory devices 10, which are coupled to a processor 416, such as a Pentium processor manufactured by Intel Corporation, and to a cache controller 418.

Figure 17:
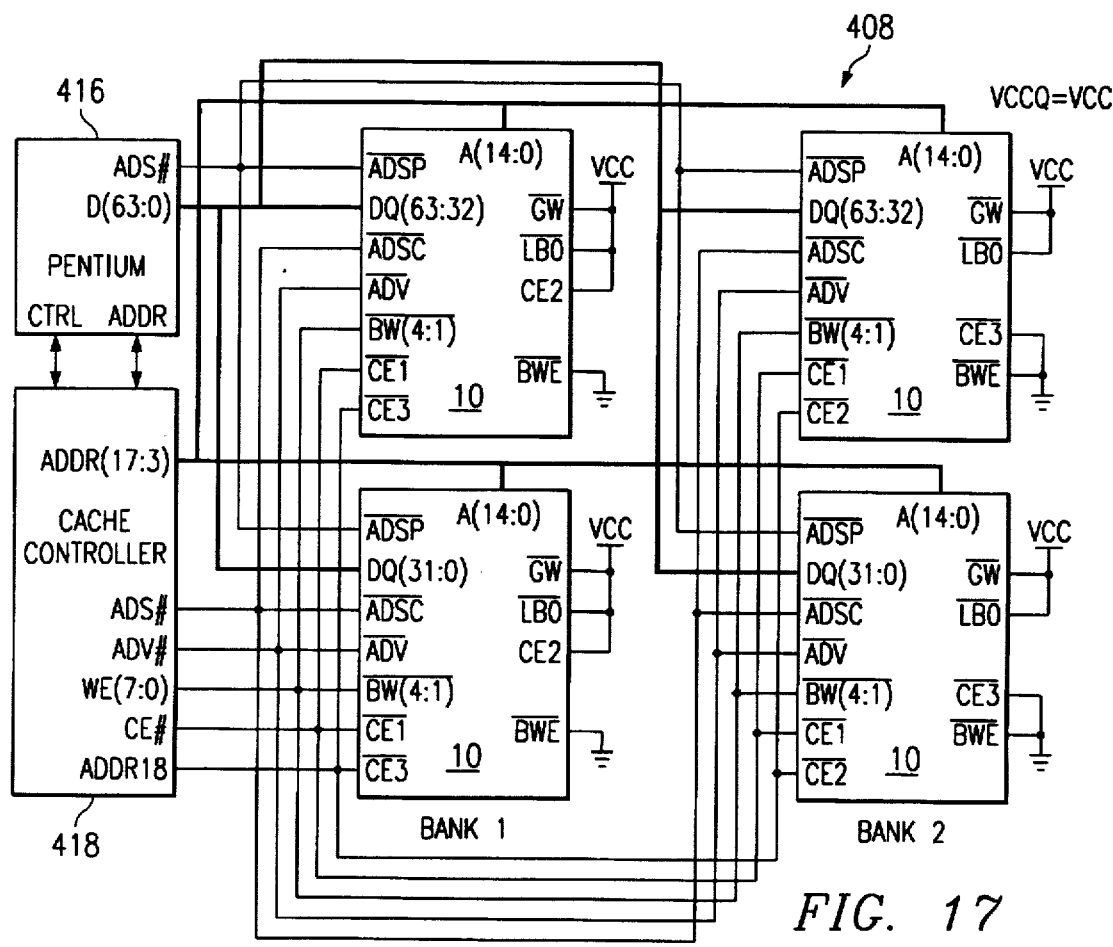
FIG. 17 is a block diagram of another embodiment of the computer circuitry of FIG. 15.

FIG. 17 is a block diagram of the computer circuitry 408 of FIG. 15 according to another embodiment of the invention. The circuitry 408 includes four memory devices 10, which are coupled to a processor 416, such as a Pentium processor, and to a cache controller 418.

It will be appreciated that, although specific embodiments of the invention have been described herein for purposes of illustration, various modifications may be made without departing from the spirit and scope of the invention. Accordingly, the invention is not limited except as by the appended claims.

I claim:

1. A read circuit, comprising:
   first and second power supply terminals;
   first and second complementary data lines;
   a sense amplifier coupled to said first and second power supply terminals, said amplifier having a sense-amplifier enable terminal and having first and second data terminals that are respectively coupled to said first and second complementary data lines; and
   a driver circuit, including,
      an input stage having first and second input terminals that are respectively coupled to said first and second data terminals of said sense amplifier, a power terminal, and first and second output terminals,
      a first switch circuit having an enable terminal coupled to said sense-amplifier enable terminal and having a switch path coupled between said power terminal and said first power supply terminal, and
      an output stage having first and second input terminals respectively coupled to said first and second output terminals of said input stage, and having an output terminal.

2. The circuit of claim 1 wherein said driver circuit further comprises:
   a second switch circuit having an enable terminal and a switch path coupled between said first output terminal of said input stage and said second power supply terminal; and
   a third switch circuit having an enable terminal and a switch path coupled between said second output terminal of said input stage and said second power supply terminal.

3. The circuit of claim 1 wherein said input stage comprises:
   a first inverter having input and output terminals respectively coupled to said first input and output terminals of said input stage; and
   a second inverter having input and output terminals respectively coupled to said second input and output terminals of said input stage.

4. The circuit of claim 1 wherein said output stage comprises:
an inverter having an input terminal coupled to said first input terminal of said output stage and having an output terminal;
a first switch having a control terminal coupled to said output terminal of said inverter and having a switch path coupled between said first power supply terminal and said output terminal of said output stage; and
a second switch having a control terminal coupled to said second input terminal of said output stage and having a switch path coupled between said second power supply terminal and said output terminal of said output stage.

5. A method for driving a signal path, comprising:
receiving complementary logic signals on first and second logic lines, respectively;
amplifying a difference between said complementary logic signals when an enable signal has a first state;
providing an amplified difference signal on said first and second logic lines;
generating a single-ended output signal on said signal path from said amplified difference signal when said enable signal has said first state; and
drawing substantially zero supply current when said enable signal has a second state.

6. The method of claim 5 wherein:
said generating comprises,
receiving said amplified difference signal with an input circuit,
generating with said input circuit an intermediate signal when said enable signal has said first state,
receiving said intermediate signal with an output circuit, and
generating with said output circuit said single-ended output signal; and
said drawing comprises cutting off with a first switch substantially all supply current to said input circuit.

7. The method of claim 6 wherein said drawing further comprises coupling an input terminal of said output circuit to a supply voltage.

8. The method of claim 6 wherein said cutting off comprises uncoupling said input stage from a power supply.

9. A read circuit for reading a memory cell, comprising:
a sense amplifier coupled to a pair of read lines that carry respective complementary data signals from said memory cell during a read cycle, said sense amplifier operable to receive a sense-amplifier enable signal, and, when said sense-amplifier enable signal has an active level, said sense amplifier operable to amplify said data signals into amplified complementary data signals and to drive said amplified complementary data signals onto said respective read lines; and
a signal driver that is coupled to said read lines and that is operable to receive said sense-amplifier enable signal, said driver operable to generate at an output terminal a data signal from said amplified complementary data signals when said sense-amplifier enable signal has said active level and to draw substantially zero supply current when said sense-amplifier enable signal has an inactive level regardless of any signals on said read lines.

10. The read circuit of claim 9 wherein said signal driver comprises:
an input circuit operable to receive said amplified complementary data signals and to generate a pair of intermediate signals from said amplified complementary data signals when said sense-amplifier enable signal has said active level;
an output circuit coupled to said input circuit and operable to receive said intermediate signals and to generate said data signal from said intermediate signals; and
a first switch circuit coupled to said input circuit and operable to receive said sense amplifier enable signal and to cut off substantially all supply current to said input circuit when said sense-amplifier enable signal has said inactive level.

11. The read circuit of claim 10 wherein said signal driver further comprises a second switch circuit coupled to said output circuit and operable to receive said sense-amplifier enable signal and to cause said output circuit to draw substantially zero supply current when said sense-amplifier enable signal has said inactive level.

12. The read circuit of claim 9 wherein said signal driver is operable to drive said output terminal to a high-impedance state when said sense-amplifier enable signal has said inactive level.

13. A read circuit that is coupled to a bit line and a bit complement line of a memory cell via a pair of read lines, said read circuit for providing data stored in said memory cell to a data line, said read circuit comprising:
first and second power-supply terminals;
a sense amplifier having first and second input terminals respectively coupled to said read lines, an equilibrate terminal, a sense-amplifier enable terminal, and first and second power terminals respectively coupled to said first and second power-supply terminals; and
a data-line driver, comprising,
a driver enable terminal that is coupled to said sense-amplifier enable terminal,
an input stage having first and second input terminals respectively coupled to said read lines, a third power terminal, a fourth power terminal coupled to said second power-supply terminal, and first and second output terminals,
a first switch having a control terminal coupled to said driver enable terminal, said first switch coupled between said third power terminal and said first power-supply terminal, and
an output stage having first and second input terminals respectively coupled to said first and second output terminals of said input stage, and having an output terminal coupled to said data line.

14. The read circuit of claim 13 wherein said data-line driver further comprises:
a second switch having a control terminal coupled to said driver enable terminal, said second switch coupled between said first output terminal of said input stage and said fourth power terminal; and
a third switch having a control terminal coupled to said driver enable terminal, said third switch coupled between said second output terminal of said input stage and said fourth power terminal.

15. The read circuit of claim 13 wherein said input stage comprises:
a first inverter having input and output terminals respectively coupled to said first input and output terminals of said input stage; and
a second inverter having input and output terminals respectively coupled to said second input and output terminals of said input stage.

16. The driver of claim 13 wherein said output stage comprises:

an inverter having an input terminal coupled to said first input terminal of said output stage and having an output terminal;

a second switch having a control terminal coupled to said output terminal of said inverter, said second switch coupled between said third power terminal and said output terminal of said output stage; and a third switch having a control terminal coupled to said second input terminal of said output stage, said third switch coupled between said fourth power terminal and said output terminal of said output stage.

17. The read circuit of claim 13, further comprising an inverter that is coupled between said sense-amplifier and drive enable terminals, said inverter having an input terminal coupled to said sense-amplifier enable terminal and having an output terminal coupled to said driver enable terminal.

18. A method for reading a memory cell that provides respective complementary data signals on a pair of read lines, the method comprising:

receiving with a dynamic sense amplifier a sense-amplifier enable signal;

amplifying said complementary data signals with said sense amplifier when said sense-amplifier enable signal has an active level;

providing said amplified complementary data signals on said respective read lines;

receiving said sense-amplifier enable signal and said amplified complementary data signals with a data-signal driver that is coupled to a power supply and to said read lines;

generating with said data-signal driver at an output terminal a data signal from said amplified complementary data signals when said sense-amplifier enable signal has said active level; and causing said data-signal driver to draw substantially zero current from said power supply when said sense-amplifier enable signal has an inactive level regardless of any signals other than said sense-amplifier enable signal that said data-signal driver receives.

19. The method of claim 18 wherein:

said receiving said amplified complementary data signals comprises receiving said amplified complementary data signals with an input circuit and generating with said input circuit intermediate signals while said sense-amplifier enable signal has said active level;

said generating comprises receiving said intermediate signals with an output circuit and generating said data signal with said output circuit; and said causing comprises disconnecting said input circuit from said power supply.

20. The method of claim 19, further comprising driving with said output stage said output terminal to a high impedance when said sense-amplifier enable signal has said inactive level.

21. The read circuit of claim 1, further comprising an inverter that is coupled between said sense-amplifier enable terminal and said enable terminal of said first switch circuit, said inverter having an input terminal coupled to said sense-amplifier enable terminal and having an output terminal coupled to said enable terminal of said first switch circuit.

22. The circuit of claim 1 wherein said input stage comprises:

a first inverter having input, output, and power terminals respectively coupled to said first input, first output, and power terminals of said input stage; and a second inverter having input, output, and power terminals respectively coupled to said second input, second output, and power terminals of said input stage.

23. The method of claim 5 wherein:

said generating comprises, inverting said enable signal, receiving said inverted enable signal and said amplified difference signal with an input circuit, generating with said input circuit an intermediate signal when said enable signal has said first state, receiving said intermediate signal with an output circuit, and generating with said output circuit said single-ended output signal; and said drawing comprises cutting off with a first switch substantially all supply current to said input circuit.

24. The method of claim 5 wherein:

said generating comprises, receiving said amplified difference signal with an input circuit, generating with said input circuit an intermediate signal when said enable signal has said first state, receiving said intermediate signal with an output circuit, and generating with said output circuit said single-ended output signal; and said drawing comprises cutting off with a single switch substantially all supply current to said input circuit.

25. The read circuit of claim 9, further comprising:

a circuit that is operable to receive said sense-amplifier enable signal and to generate an inverted sense-amplifier enable signal; and wherein said signal driver is operable to receive said inverted sense-amplifier enable signal.

26. The read circuit of claim 9 wherein said signal driver comprises:

an input circuit operable to receive said amplified complementary data signals and to generate a pair of intermediate signals from said amplified complementary data signals when said sense-amplifier enable signal has said active level;

an output circuit coupled to said input circuit and operable to receive said intermediate signals and to generate said data signal from said intermediate signals; and a single switch coupled to said input circuit and operable to receive said sense-amplifier enable signal and to cut off substantially all supply current to said input circuit when said sense-amplifier enable signal has said inactive level.

27. The circuit of claim 13 wherein said input stage comprises:

a first inverter having input, output, and power terminals respectively coupled to said first input, first output, and third power terminals of said input stage; and a second inverter having input, output, and power terminals respectively coupled to said second input, second output, and third power terminals of said input stage.

28. The method of claim 18, further comprising:

inverting said sense-amplifier enable signal; and wherein said receiving said sense-amplifier enable signal with a data-signal driver comprises receiving said inverted sense-amplifier enable signal.

29. The method of claim 18 wherein:

said receiving said amplified complementary data signals comprises receiving said amplified complementary data signals with an input circuit and generating with said input circuit intermediate signals while said sense-amplifier enable signal has said active level;

said generating comprises receiving said intermediate signals with an output circuit and generating said data signal with said output circuit; and said causing comprises disconnecting said input circuit from said power supply with a single switch.

30. A read circuit, comprising:

first and second supply terminals;

first and second complementary data lines;

a sense amplifier coupled to said first and second supply terminals, said amplifier having first and second data terminals that are respectively coupled to said first and second complementary data lines; and a driver circuit, including,
- a first input circuit having an input terminal coupled to said first data terminal of said sense amplifier, an output terminal, and a power terminal,
- a second input circuit having an input terminal coupled to said second data terminal of said sense amplifier, an output terminal, and a power terminal,
- a switch having an enable terminal and having a switch path coupled from said first power supply terminal to both of said power terminals of said first and second input circuits, and
- an output stage having first and second input terminals respectively coupled to said output terminals of said first and second input circuits, and having an output terminal.

31. The read circuit of claim 30 wherein said first and second input circuits comprise respective inverters.

32. A method for driving a signal path, comprising:

receiving complementary logic signals on first and second logic lines, respectively;

amplifying a difference between said complementary logic signals;

providing an amplified difference signal on said first and second logic lines;

receiving said amplified difference signal with an input circuit;

generating with said input circuit an intermediate signal when an enable signal has a first sate;

receiving said intermediate signal with an output circuit;

generating with said output circuit said single-ended output signal; and cutting off with a single switch substantially all supply current to said input circuit when said enable signal has a second state.

33. The method of claim 32 wherein said cutting off comprises disconnecting said input stage from a power supply with said single switch.

* * * * *